United States Patent
Hua et al.

(10) Patent No.: US 12,557,296 B2
(45) Date of Patent: Feb. 17, 2026

(54) TRANSISTOR AND METHOD FOR MANUFACTURING SAME, SEMICONDUCTOR DEVICE AND METHOD FOR MANUFACTURING SAME

(71) Applicant: ICLEAGUE TECHNOLOGY CO., LTD., Zhejiang (CN)

(72) Inventors: Wenyu Hua, Jiaxing (CN); Xilong Wang, Jiaxing (CN)

(73) Assignee: ICLEAGUE TECHNOLOGY CO., LTD., Zhejiang (CN)

( * ) Notice: Subject to any disclaimer, the term of this patent is extended or adjusted under 35 U.S.C. 154(b) by 701 days.

(21) Appl. No.: 17/782,868

(22) PCT Filed: Aug. 6, 2021

(86) PCT No.: PCT/CN2021/111345
§ 371 (c)(1),
(2) Date: Jun. 6, 2022

(87) PCT Pub. No.: WO2022/222310
PCT Pub. Date: Oct. 27, 2022

(65) Prior Publication Data
US 2024/0179922 A1     May 30, 2024

(30) Foreign Application Priority Data

Apr. 20, 2021   (CN) .......................... 202110421932.3
Apr. 20, 2021   (CN) .......................... 202110422036.9

(51) Int. Cl.
  *H10B 63/00*   (2023.01)
  *H10B 12/00*   (2023.01)
  *H10B 63/10*   (2023.01)

(52) U.S. Cl.
  CPC ............. *H10B 63/34* (2023.02); *H10B 12/05* (2023.02); *H10B 12/33* (2023.02); *H10B 63/10* (2023.02)

(58) Field of Classification Search
  CPC ...... H10B 30/63; H10B 30/025; H10B 84/16; H10B 84/095; H10B 12/0383;
  (Continued)

(56) References Cited

U.S. PATENT DOCUMENTS 6,349,052 B1   2/2002   Hofmann et al.
7,999,313 B2   8/2011   Kim
(Continued)

FOREIGN PATENT DOCUMENTS

CN   101556954 A   10/2009
CN   101933136 A   12/2010
(Continued)

OTHER PUBLICATIONS

International Search Report (PCT/ISA/210) mailed on Jan. 19, 2022, by the State Intellectual property Office of the P.R. China as the International Searching Authority for International Application No. PCT/CN2021/111345. (3 pages).
(Continued)

*Primary Examiner* — Jay C Kim
*Assistant Examiner* — John Lin
(74) *Attorney, Agent, or Firm* — Buchanan Ingersoll & Rooney P.C

(57) ABSTRACT

Embodiments provide a transistor and a method for manufacturing same, a semiconductor device and a method for manufacturing same. The method for manufacturing a transistor includes operations. A wafer is provided, the wafer has multiple transistor formation regions, each of which has a transistor pillar with an exposed gate formation surface. A gate oxide layer and a gate are sequentially formed on the
(Continued)

gate formation surface of each of the transistor pillars. A source is formed at a first end of each of the transistor pillars. A drain is formed at a second end of each of the transistor pillars, here the first end and the second end are opposite ends of each of the transistor pillars in a first direction which is a thickness direction of the wafer; a part of each of the transistor pillars between the source and the drain forms a channel region of the transistor.

20 Claims, 18 Drawing Sheets

(58) Field of Classification Search
CPC ...... H10B 12/395; H10B 63/34; H10D 30/63; H10D 30/025; H10D 84/16; H10D 84/095
See application file for complete search history.

(56) References Cited

U.S. PATENT DOCUMENTS

| | | | |
|---|---|---|---|
| 8,202,781 | B2 | 6/2012 | Kim |
| 8,207,032 | B2 | 6/2012 | Fischer et al. |
| 8,390,062 | B2 | 3/2013 | Kobayashi et al. |
| 8,409,948 | B2 | 4/2013 | Fischer et al. |
| 8,513,103 | B2 | 8/2013 | Park et al. |
| 8,536,008 | B2 | 9/2013 | Kobayashi et al. |
| 9,136,376 | B2 | 9/2015 | Moon et al. |
| 10,347,745 | B2 | 7/2019 | Suvarna et al. |
| 10,361,206 | B2 | 7/2019 | Moon et al. |
| 10,388,658 | B1 | 8/2019 | Ramaswamy |
| 10,892,262 | B2 | 1/2021 | Moon et al. |
| 10,950,608 | B2 | 3/2021 | Moon et al. |
| 11,145,656 | B2 | 10/2021 | Ramaswamy |
| 2001/0003513 | A1* | 6/2001 | Shau ............... G11C 7/18 257/E27.092 |
| 2006/0046407 | A1 | 3/2006 | Juengling |
| 2006/0158948 | A1* | 7/2006 | Fuji ............... G11C 13/0069 365/222 |
| 2009/0256187 | A1 | 10/2009 | Kim |
| 2011/0263090 | A1 | 10/2011 | Kim |
| 2012/0018801 | A1 | 1/2012 | Kobayashi et al. |
| 2012/0052640 | A1 | 3/2012 | Fischer et al. |
| 2012/0112270 | A1 | 5/2012 | Park et al. |
| 2012/0238061 | A1 | 9/2012 | Fischer et al. |
| 2013/0130471 | A1 | 5/2013 | Kobayashi et al. |
| 2013/0234240 | A1 | 9/2013 | Moon et al. |
| 2014/0117366 | A1* | 5/2014 | Saitoh ............... H10D 84/0128 438/198 |
| 2015/0348976 | A1 | 12/2015 | Moon et al. |
| 2018/0083121 | A1 | 3/2018 | Suvarna et al. |
| 2019/0252387 | A1 | 8/2019 | Moon et al. |
| 2019/0273081 | A1 | 9/2019 | Moon et al. |
| 2019/0333917 | A1 | 10/2019 | Ramaswamy |
| 2021/0183864 | A1 | 6/2021 | Ramaswamy |

FOREIGN PATENT DOCUMENTS

| | | |
|---|---|---|
| CN | 102339831 A | 2/2012 |
| CN | 102468181 A | 5/2012 |
| CN | 103311249 A | 9/2013 |
| CN | 107845579 A | 3/2018 |
| CN | 110931559 A | 3/2020 |
| CN | 112106196 A | 12/2020 |
| CN | 113314421 A | 8/2021 |
| JP | 2001119000 A | 4/2001 |
| KR | 100956476 B1 | 5/2010 |
| KR | 20120048985 A | 5/2012 |

OTHER PUBLICATIONS

Office Action (Notification of Grant of Invention Patent) issued on May 29, 2023, by the Chinese Patent Office in corresponding Chinese Patent Application No. 202110422036.9, and an English Translation of the Office Action. (5 pages).

Office Action (Second Office Action) issued on May 29, 2023, by the Chinese Patent Office in corresponding Chinese Patent Application No. 202110421932.3, and an English Translation of the Office Action. (13 pages).

\* cited by examiner

TRANSISTOR AND METHOD FOR MANUFACTURING SAME, SEMICONDUCTOR DEVICE AND METHOD FOR MANUFACTURING SAME

CROSS-REFERENCE TO RELATED APPLICATIONS

The application is filed based on Chinese Patent Application No. 202110422036.9 filed on Apr. 20, 2021 and entitled "COLUMNAR TRANSISTOR AND METHIOD FOR MANUFACTURING THE SAME, SEMICONDUCTOR DEVICE AND METHOD FOR MANUFACTURING THE SAME" and Chinese Patent Application No. 202110421932.3 filed on Apr. 20, 2021 and entitled "L-SHAPED TRANSISTOR AND METHIOD FOR MANUFACTURING THE SAME, SEMICONDUCTOR DEVICE AND METHOD FOR MANUFACTURING THE SAME", and claims priorities to these Chinese Patent Applications, the entire contents of which are incorporated herein by reference in their entireties.

TECHNICAL FIELD

The disclosure relates to the technical field of semiconductor, and relates to, but is not limited to a transistor and a method for manufacturing the same, a semiconductor device and a method for manufacturing the same.

BACKGROUND

A transistor is widely used as a switching device or a driving apparatus in an electronic device. For example, the transistor may be used in a Dynamic Random Access Memory (DRAM) to control a capacitor in each memory cell.

In the related art, a transistor mainly includes a planar transistor and a Buried Channel Array Transistor (BCAT). However, no matter whether the transistor is a planar transistor or a BCAT, its source S and drain D are located on two horizontal sides of its gate G respectively, and in this structure, the source and the drain occupy different positions respectively, which makes the area of the transistor larger. In addition, in a memory device, the source and the drain of the transistor are connected to different structures respectively after they are formed. When the source and the drain are located on two horizontal sides of the gate respectively, circuit wiring inside the memory is complicated and the manufacturing process thereof is difficult to be implemented.

SUMMARY

Embodiments of the disclosure provide a method for manufacturing a transistor. The method may include the following operations.

A wafer is provided, the wafer has multiple transistor formation regions, each of which has a transistor pillar with an exposed gate formation surface.

A gate oxide layer and a gate are sequentially formed on the gate formation surface of each of the transistor pillars.

A source is formed at a first end of each of the transistor pillars.

A drain is formed at a second end of each of the transistor pillars, here the first end and the second end are opposite ends of each of the transistor pillars in a first direction which is a thickness direction of the wafer; a part of each of the transistor pillars between the source and the drain forms a channel region of the transistor.

In some embodiments, the gate formation surface may include a sidewall or an L-shaped surface.

The operation of forming the gate oxide layer and the gate sequentially on the gate formation surface of each of the transistor pillars may include the following operations.

The gate oxide layer and the gate are sequentially formed on the sidewall of each of the transistor pillars.

Or, the gate oxide layer and the gate are sequentially formed on the L-shaped surface of each of the transistor pillars.

In some embodiments, each of the transistor formation regions may further have an insulating layer surrounding other sidewalls of each of the transistor pillars; each of the transistor formation regions is formed by the following operations.

The wafer is partially etched along the first direction with a first surface of the wafer as an etching start point, to form a grid-like etched trench composed of multiple silicon pillars, here each of the silicon pillars has a first preset thickness which is smaller than an initial thickness of the wafer, and the first surface of the wafer is any surface of the wafer along the first direction.

An insulating material is deposited in the grid-like etched trench to form an insulating layer surrounding each of the silicon pillars.

Each of the silicon pillars and the insulating layer are etched to form the transistor pillar having an exposed sidewall or an exposed L-shaped surface, to obtain the transistor formation region.

In some embodiments, the operation of etching each of the silicon pillars and the insulating layer to form the transistor pillar having the exposed sidewall may include the following operations.

Each of the silicon pillars and the insulating layer are partially etched along the first direction with a position of an edge of each of the silicon pillars as an etching start point, to remove the silicon pillar and the insulating layer with a preset size in a second direction and with the first preset thickness in the first direction, to form the transistor pillar having the exposed sidewall and form an etched trench, here the preset size is smaller than an initial size of each of the silicon pillars in the second direction which is perpendicular to the first direction.

In some embodiments, the method may further include the following operations before forming the gate oxide layer and the gate.

A first isolation layer is formed by deposition at the bottom of the etched trench.

Correspondingly, the operation of forming the gate oxide layer and the gate sequentially on the sidewall of each of the transistor pillars may include the following operations.

An initial gate oxide layer is formed on the sidewall of each of the transistor pillars by in-situ oxidation.

A polysilicon material is deposited in the etched trench to form a polysilicon layer.

The initial gate oxide layer and the polysilicon layer are etched along the first direction, to remove part of the thicknesses of the initial gate oxide layer and the polysilicon layer in the first direction to form the gate oxide layer and the gate.

In some embodiments, the method may further include the following operations after forming the gate oxide layer and the gate.

A second isolation layer is formed by deposition in the etched trench, here the second isolation layer is located within a projection region of the transistor pillar in the second direction, and a size of the second isolation layer in a third direction is equal to a size of the transistor pillar in the third direction.

In some embodiments, the method may further include the following operations before forming the drain.

The wafer is thinned from a second surface of the wafer until exposing the first isolation layer and the second end of the transistor pillar; here the second surface of the wafer is a surface opposite to the first surface of the wafer.

In some embodiments, the operation of etching each of the silicon pillars and the insulating layer to form the transistor pillar having the exposed L-shaped surface may include the following operations.

Each of the silicon pillars and the insulating layer are partially etched along the first direction with a position of an edge of each of the silicon pillars as an etching start point, to remove the silicon pillar and the insulating layer with a preset size in a second direction and with a second preset thickness in the first direction, to form the transistor pillar having the L-shaped surface and form an etched trench, here the second preset thickness is smaller than the first preset thickness, the preset size is smaller than an initial size of each of the silicon pillars in the second direction which is perpendicular to the first direction.

In some embodiments, the L-shaped surface may include a vertical surface and a horizontal surface perpendicular to the vertical surface.

The operation of forming the gate oxide layer and the gate sequentially on the L-shaped surface of each of the transistor pillars may include the following operations.

An initial gate oxide layer is formed on each of the vertical surface and the horizontal surface by in-situ oxidation.

A polysilicon material is deposited in the etched trench having the initial gate oxide layer to form a polysilicon layer.

The initial gate oxide layer and the polysilicon layer are etched along the first direction, to remove part of the thicknesses of the initial gate oxide layer and the polysilicon layer in the first direction to form the gate oxide layer and the gate.

In some embodiments, the method may further include the following operations after forming the gate oxide layer and the gate.

An isolation layer is formed by deposition in the etched trench, here the isolation layer is located within a projection region of the transistor pillar in the second direction, and a size of the isolation layer in a third direction is equal to a size of the transistor pillar in the third direction.

In some embodiments, the method may further include the following operations before forming the drain.

The wafer is thinned from a second surface of the wafer to remove a part of the wafer with a third preset thickness and expose the second end of the transistor pillar, here the third preset thickness is smaller than a difference between the initial thickness and the second preset thickness, and the second surface of the wafer is a surface opposite to the first surface of the wafer.

In some embodiments, the operation of forming the drain at the second end of the transistor pillar may include the following operations.

Ion implantation is performed on the second end of the transistor pillar to a preset depth to form the drain, here the preset depth is smaller than or equal to the difference between the initial thickness and the second preset thickness.

In some embodiments, shapes of the source and the drain may be the same or different.

The shapes of the source and the drain may include any one of a square, a semicircle, a triangle, or any polygon.

Embodiments of the disclosure provide a transistor. The transistor includes a channel region, a source, a drain, a gate and a gate oxide layer.

The source is located at a first end of the channel region.

The drain is located at a second end of the channel region, here the first end and the second end are opposite ends of the channel region in a first direction which is a thickness direction of a wafer forming the channel region.

The gate is located on any side of the channel region and corresponds to the channel region.

The gate oxide layer is located between the channel region and the gate.

In some embodiments, the source, the channel region and the drain form an L-shaped structure or a columnar structure.

Embodiments of the disclosure provide a method for forming a semiconductor device. The method may include the following operations.

At least one memory cell is formed, here each of the at least one memory cell includes at least a transistor including a gate, a source and a drain, and manufactured by the above method for manufacturing a transistor.

A word line is formed, here the word line is connected to the gate of the transistor, and is configured to provide a word line voltage and control the transistor to be turned on or off by the word line voltage.

A bit line is formed, here the bit line is connected to the source or the drain of the transistor, and is configured to perform a read or write operation on each of the at least one memory cell when the transistor is turned on.

Embodiments of the disclosure further provide a semiconductor device. The semiconductor device includes at least one memory cell, a word line and a bit line, each of the at least one memory cell includes at least the above transistor, and the transistor includes at least a gate, a source and a drain.

The word line is connected to the gate of the transistor, and is configured to provide a word line voltage and control the transistor to be turned on or off by the word line voltage.

The bit line is connected to the source or the drain of the transistor, and is configured to perform a read or write operation on each of the at least one memory cell when the transistor is turned on.

In some embodiments, each of the at least one memory cell may further include a storage capacitor.

The storage capacitor has one end connected to the drain or the source of the transistor and the other end grounded, and is configured to store data written in each of the at least one memory cell.

In some embodiments, each of the at least one memory cell may further include an adjustable resistor.

The adjustable resistor is connected between the bit line and the source of the transistor, or is connected between the bit line and the drain of the transistor, and is configured to adjust a state of data stored in each of the at least one memory cell by a bit line voltage provided by the bit line.

In some embodiments, when the semiconductor device includes multiple memory cells, the multiple memory cells are connected in parallel or in series.

According to a transistor and a method for manufacturing the same, a semiconductor device and a method for manufacturing the same provided in the embodiments of the disclosure, since the source and the drain of the formed transistor are located at the first end and the second end of the channel region in the first direction respectively, and the first direction is the thickness direction of the wafer forming the channel region, the area of the transistor is greatly reduced. Moreover, the transistor provided in the embodiments of the disclosure may be used to form a memory, and since the drain and the source of the transistor are located on different surfaces of the wafer, different structures of the memory connected to the source and the drain may be designed on two surfaces of the wafer respectively, that is, designed on opposite surfaces of the wafer respectively, thereby simplifying the circuit layout inside the memory and reducing difficulty of the process of manufacturing the memory.

BRIEF DESCRIPTION OF THE DRAWINGS

In the drawings (which are not necessary to be drawn to scale), similar reference numerals may describe similar components in different figures. Similar reference numerals with different suffix letters may indicate different examples of similar components. The drawings generally show various embodiments discussed herein by way of example without limitation.

DETAILED DESCRIPTION

The technical solutions of the disclosure will be further described in detail below in combination with the drawings in the embodiments of the disclosure. The following embodiments are intended to illustrate the disclosure, but are not intended to limit the scope of the disclosure.

In the following descriptions, usage of suffixes such as "module" or "unit" used to indicate elements is only intended to facilitate the description of the disclosure, and has no specific meaning themselves. Therefore, "module" or "unit" may be used in a mixed manner.

Figure 1A:
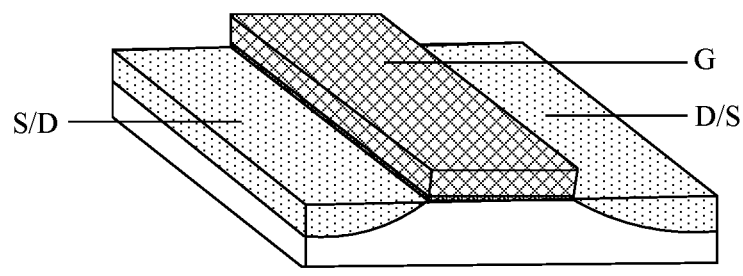
FIG. 1A illustrates a schematic structural diagram of a planar transistor in the related art.
Figure 1B:
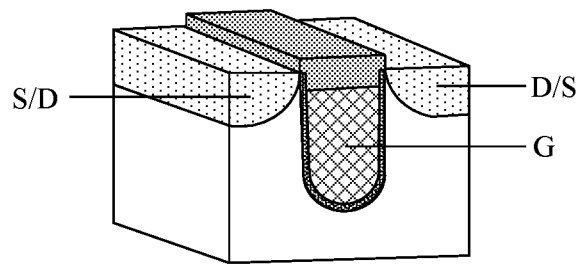
FIG. 1B illustrates a schematic structural diagram of a BCAT in the related art.

In the related art, a transistor of a mainstream memory includes a planar transistors (Planar) and a BCAT. However, no matter whether the transistor is a planar transistor or a BCAT, its source and drain are located on two horizontal sides of its gate respectively according to its structure. As illustrated in FIGS. 1A and 1B, the source S and the drain D of the transistor in the related art are located on two horizontal sides of the gate G respectively. In this structure, the source and the drain occupy different positions respectively, so that no matter whether the transistor is a planar transistor or a BCAT, it has a larger area.

Figure 1C:
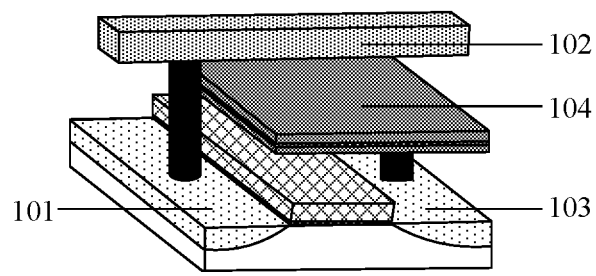
FIG. 1C illustrates a schematic structural diagram of a DRAM memory cell composed of planar transistors in the related art.
Figure 1D:
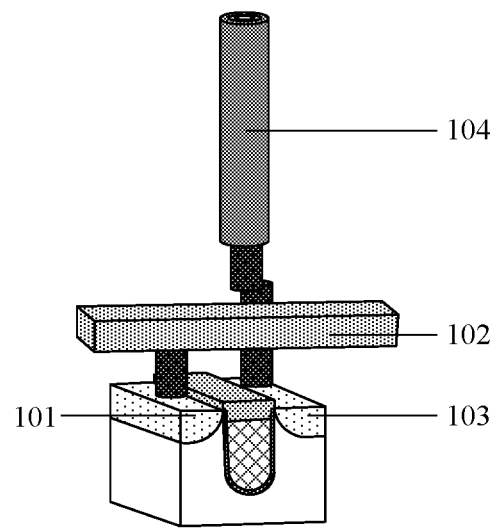
FIG. 1D illustrates a schematic structural diagram of a DRAM memory cell composed of BCATs in the related art.

In addition, since the transistor may be prepared on a silicon substrate, the transistor may be used in various memories, such as DRAM. Generally, DRAM is composed of multiple memory cells, each of which is mainly composed of a transistor and a capacitor controlled by the transistor. That is, DRAM is a memory cell with one transistor and one capacitor C (1T1C). As illustrated in FIGS. 1C and 1D, the source (or the drain) 101 of the transistor in the DRAM memory cell is connected to a bit line 102, and the drain (or the source) 103 thereof is connected to the capacitor 104. A chip composed of BCATs is usually packaged in Chips on Board (COB) manner to form a memory. Since the source and the drain of each of the planar transistor and the BCAT are located on two horizontal sides of the gate respectively, the bit line and capacitor in the DRAM memory cell are also located on the same side of the gate, and the connection between the bit line, the transistor and the capacitor, the connection between the word line (WL) and the transistor, etc., need to be made in subsequent processes, which leads to complicated circuit wiring in a memory array region of the DRAM memory and a more difficult manufacturing process.

In view of the above problems in the related art, embodiments of the disclosure provide a transistor and a method for manufacturing the same, a semiconductor device and a method for manufacturing the same, which may provide a transistor structure with a smaller area, and according to the transistor structure provided in the embodiments of the disclosure, the circuit layout inside the memory may be simplified and difficulty of the process of manufacturing the memory may be reduced.

Figure 2A:
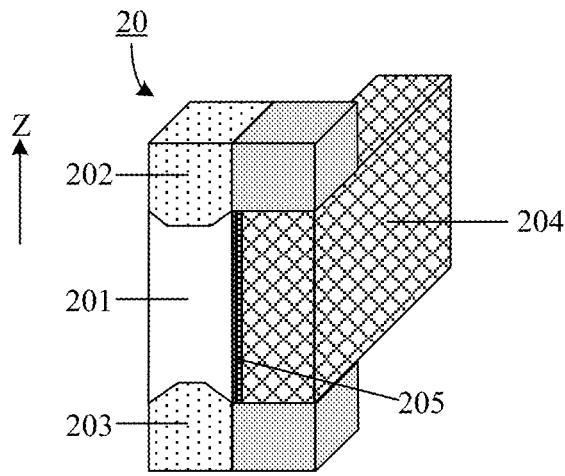
FIGS. 2A and 2B illustrate optional schematic structural diagrams of a transistor provided in an embodiment of the disclosure.
Figure 2B:
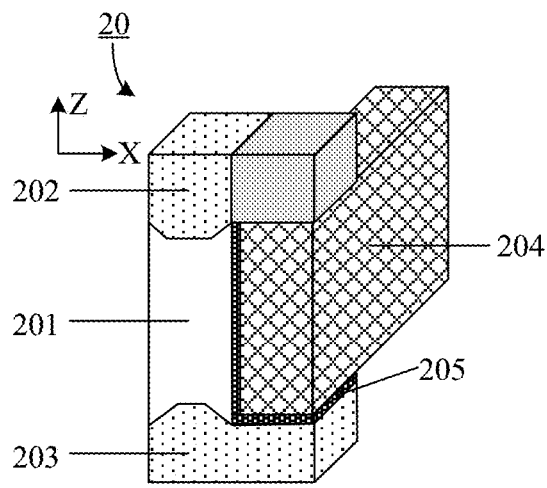

FIGS. 2A and 2B illustrate optional schematic structural diagrams of a transistor provided in an embodiment of the disclosure. As illustrated in FIGS. 2A and 2B, the transistor 20 includes a channel region 201, a source 202, a drain 203, a gate 204 and a gate oxide layer 205.

The channel region 201 has a vertical structure, the source 202 is located at a first end of the channel region 201, the drain 203 is located at a second end of the channel region 201, and the source, the channel region and the drain form a columnar structure or an L-shaped structure. The first end and the second end are opposite ends of the channel region in a first direction respectively. Here, a thickness direction of a wafer forming the channel region is defined as the first direction (a Z-axis direction as illustrated in FIGS. 2A and 2B), and any direction perpendicular to the first direction is defined as a second direction (an X-axis direction as illustrated in FIG. 2B). In the embodiments of the disclosure, positions of the source 202 and the drain 203 may be interchanged.

In some embodiments, sizes of the first end and the second end in the second direction are the same or different.

The gate 204 is located on any side of the channel region 201 and corresponds to the channel region 201, and the gate oxide layer 205 is located between the channel region 201 and the gate 204.

In the embodiments of the disclosure, the source and the drain are located at opposite ends in the thickness direction of the wafer forming the channel region respectively, that is, the source and the drain of the transistor provided in the embodiments of the disclosure are located at opposite surfaces of the wafer respectively, and thus the area of the transistor is greatly reduced.

The method for manufacturing a transistor provided in the embodiments of the disclosure may include the following operations.

In a first operation, a wafer is provided, the wafer has multiple transistor formation regions, each of which has a transistor pillar with an exposed gate formation surface.

Here the gate formation surface is a surface on which the gate is formed.

In a second operation, a gate oxide layer and a gate are sequentially formed on the gate formation surface of each of the transistor pillars.

In a third operation, a source is formed at a first end of each of the transistor pillars.

In a fourth operation, a drain is formed at a second end of each of the transistor pillars, here the first end and the second end are opposite ends of each of the transistor pillars in a first direction which is a thickness direction of the wafer; a part of each of the transistor pillars between the source and the drain forms a channel region of the transistor.

In some embodiments, the gate formation surface may include a sidewall or an L-shaped surface; correspondingly, the operation of forming the gate oxide layer and the gate sequentially on the gate formation surface of each of the transistor pillars may include the following operations. The gate oxide layer and the gate are sequentially formed on the sidewall of each of the transistor pillars. Or, the gate oxide layer and the gate are sequentially formed on the L-shaped surface of each of the transistor pillars.

The transistor provided in the embodiments of the disclosure includes a columnar transistor, and the columnar transistor may be formed by the method for manufacturing a transistor provided in the following embodiments.

Figure 3A:
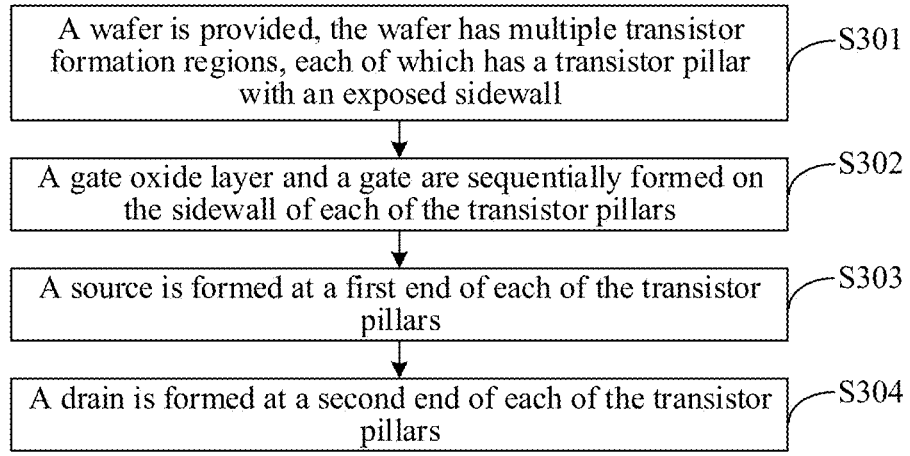
FIG. 3A illustrates an optional schematic flowchart of a method for manufacturing a columnar transistor provided in an embodiment of the disclosure.

FIG. 3A illustrates an optional schematic flowchart of a method for manufacturing a columnar transistor provided in an embodiment of the disclosure. As illustrated in FIG. 3A, the method for manufacturing a columnar transistor may include the following operations.

In operation S301, a wafer is provided, the wafer has multiple transistor formation regions, each of which has a transistor pillar with an exposed sidewall.

In operation S302, a gate oxide layer and a gate are sequentially formed on the sidewall of each of the transistor pillars.

In operation S303, a source is formed at a first end of each of the transistor pillars.

In operation S304, a drain is formed at a second end of each of the transistor pillars.

Here the first end and the second end are opposite ends of each of the transistor pillars in a first direction which is a thickness direction of the wafer; a part of each of the transistor pillars between the source and the drain forms a channel region of the transistor.

Next, referring to FIGS. 3B to 3L, the method for manufacturing a transistor provided in the embodiment of the disclosure will be further described in detail.

In the embodiment of the disclosure, each of the transistor formation regions is a region on the wafer for forming the transistor, each of the transistor formation regions has a transistor pillar with an exposed sidewall. Each of the transistor formation regions may further have an insulating layer surrounding other sidewalls of each of the transistor pillars.

Firstly, referring to FIGS. 3B to 3E, the operation S301 is performed to provide a wafer having multiple transistor formation regions, each of which has a transistor pillar with an exposed sidewall. In some embodiments, each of the transistor formation regions is formed by the following operations.

In operation S3011, the wafer is partially etched along the first direction with a first surface of the wafer as an etching start point, to form a grid-like etched trench composed of multiple silicon pillars.

Here each of the silicon pillars has a first preset thickness which is smaller than an initial thickness of the wafer, and the first surface of the wafer is any surface of the wafer along the first direction.

Here the thickness direction of the wafer is defined as the first direction. In a top surface or a bottom surface of the wafer perpendicular to the first direction, two intersecting directions are defined as the second direction and the third direction respectively. According to the second direction and the third direction, the top surface or the bottom surface of the wafer perpendicular to the first direction may be determined. For example, the second direction and the third direction are perpendicular to each other, so that any two of the first direction, the second direction and the third direction are perpendicular to each other. Here, it may be defined that the first direction is a Z-axis direction, the second direction is an X-axis direction, and the third direction is a Y-axis direction.

Figure 3B:
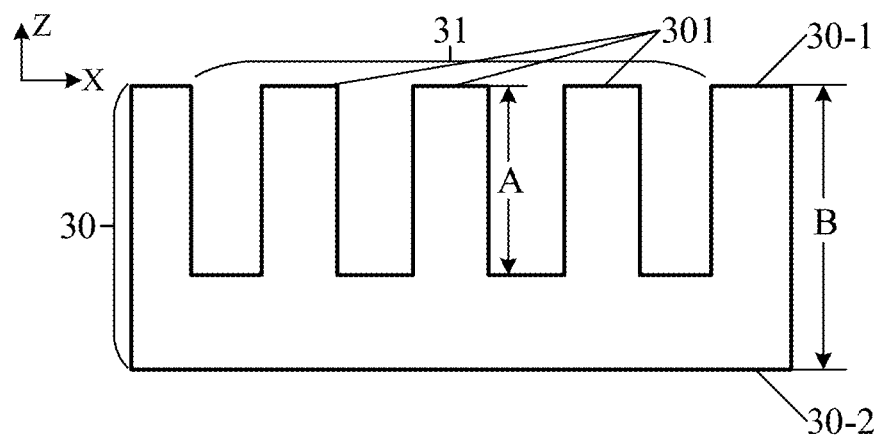
FIGS. 3B to 3L illustrate schematic structural diagrams of a process of forming a columnar transistor provided in an embodiment of the disclosure.
Figure 3C:
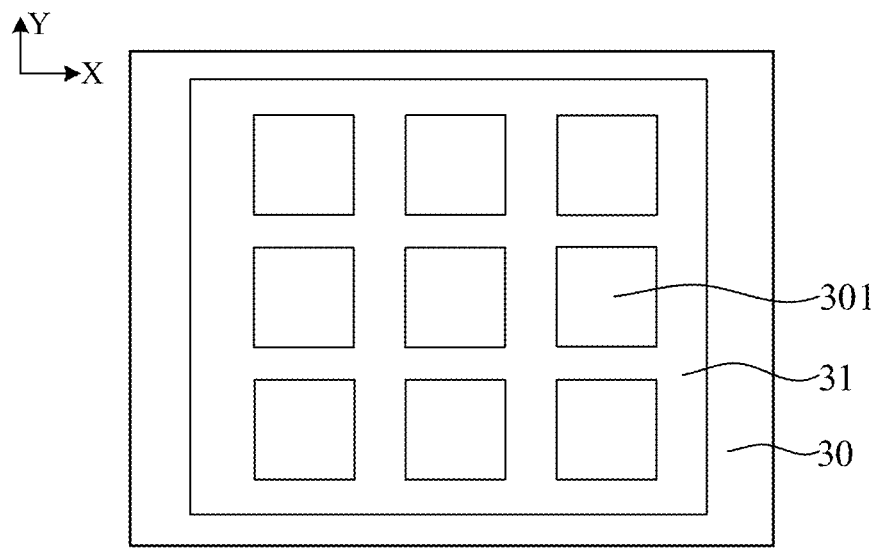

FIG. 3B illustrates a cross-sectional view of the grid-like etched trench along the first direction provided in an embodiment of the disclosure, and FIG. 3C illustrates a top view of the grid-like etched trench provided in an embodiment of the disclosure. It may be seen in combination of FIGS. 3B and 3C that the wafer 30 is partially etched along the Z-axis direction with a first surface 30-1 of the wafer as an etching start point, to form a grid-like etched trench 31 composed of multiple silicon pillars 301, each of the silicon pillars 301 is located at an intersection point in the grid, and there is an equal gap between any two adjacent silicon pillars. In the embodiments of the disclosure, each of the silicon pillars 301 has a first preset thickness A in the Z-axis direction which is smaller than an initial thickness B of the wafer, and the first surface 30-1 of the wafer is any surface of the wafer along the Z-axis direction. The wafer further includes a second surface 30-2 opposite to the first surface 30-1.

Here the wafer may be etched by a dry etching process, for example, a plasma etching process or a reactive ion etching process. It is worth noting that in the embodiments of the disclosure, the etching of the wafer is a partial etching performed along the thickness direction of the wafer, that is, the wafer will not be cut through during etching.

In operation S3012, an insulating material is deposited in the grid-like etched trench to form an insulating layer surrounding each of the silicon pillars.

Figure 3D:
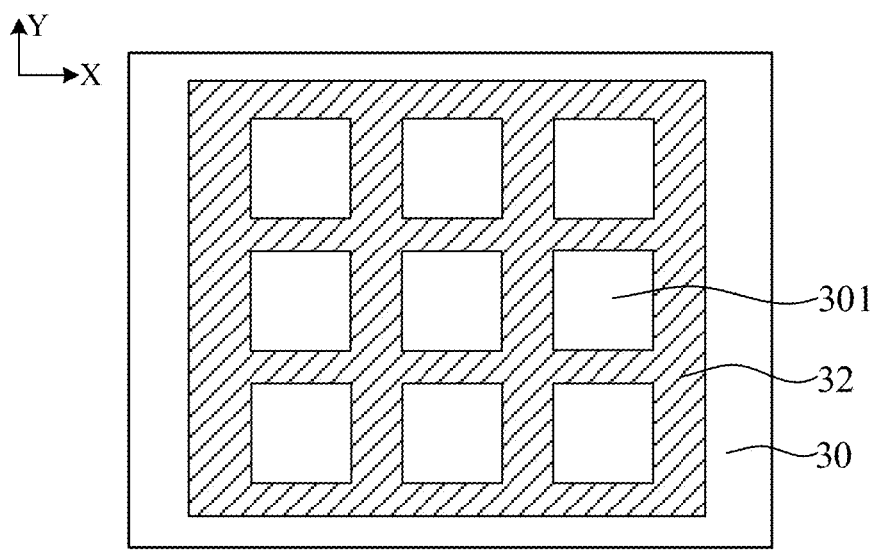

In the embodiments of the disclosure, the insulating material may be a silicon dioxide ($SiO_2$) material or another insulating material. FIG. 3D illustrates a top view of the insulating layer formed in the grid-like etched trench provided in an embodiment of the disclosure. As illustrated in FIG. 3D, the insulating material $SiO_2$ is deposited in the grid-like etched trench 31, and each of silicon pillars 301 is filled with the insulating material $SiO_2$ at the surrounding thereof to form an insulating layer 32.

It should be noted that during actual deposition of the insulating material, the insulating material $SiO_2$ will cover surfaces of the silicon pillar 301. Generally, after the deposition is completed, a Chemical Mechanical Polishing (CMP) process is used to remove excess insulating material $SiO_2$ to expose surfaces of the silicon pillar 301.

In operation S3013, each of the silicon pillars and the insulating layer are etched to form the transistor pillar having an exposed sidewall, to obtain the transistor formation region.

In some embodiments, the operation of etching each of the silicon pillars and the insulating layer to form the transistor pillar having the exposed sidewall may include the following operations. Each of the silicon pillars and the insulating layer are partially etched along the first direction with a position of an edge of each of the silicon pillars as an etching start point, to remove the silicon pillar and the insulating layer with a preset size in a second direction and with the first preset thickness in the first direction, to form the transistor pillar having the exposed sidewall and form an etched trench.

Figure 3E:
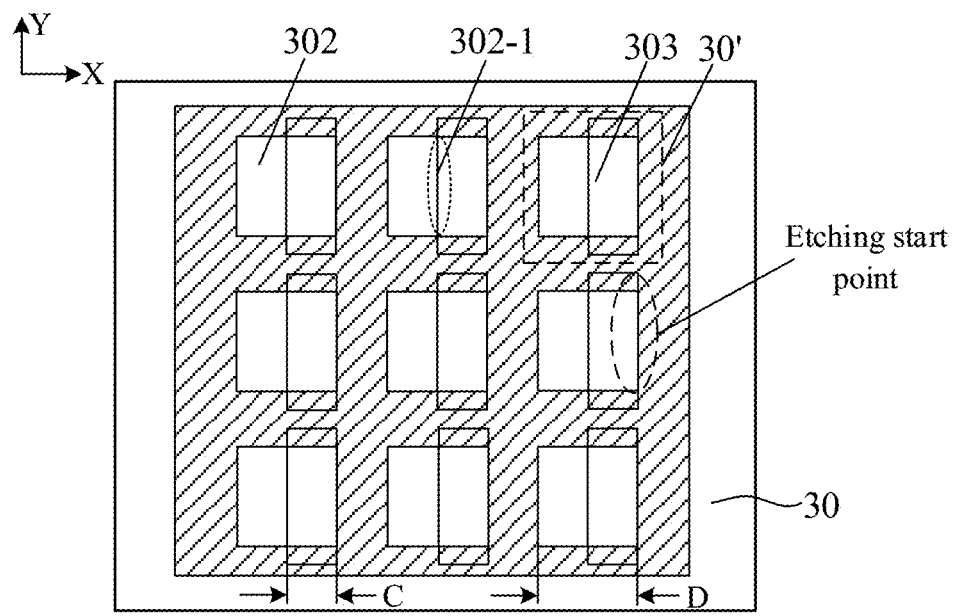

FIG. 3E illustrates a top view of a transistor pillar provided in an embodiment of the disclosure. As illustrated in FIG. 3E, each of the silicon pillars and the insulating layer are etched along the X-axis direction with a position of an edge of each of the silicon pillars as an etching start point, to remove the silicon pillar and the insulating layer with a preset size C in the X-axis direction and with the first preset thickness A in the Z-axis direction, to form the transistor pillar 302 and an etched trench 303, thereby forming a transistor formation region 30', here the transistor pillar has an exposed sidewall 302-1. In the embodiments of the disclosure, the preset size C is smaller than an initial size D of each of the silicon pillars 301 in the X-axis direction.

It should be noted that many transistors may be formed on a wafer. Therefore, there are multiple transistor formation regions on a wafer. In the embodiments of the disclosure, only a limited number of transistor formation regions are shown as an example, for ease of description.

Figure 3F:
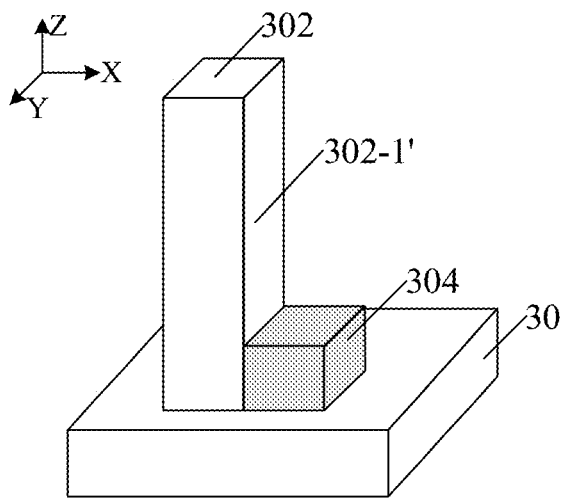
Figure 3G:
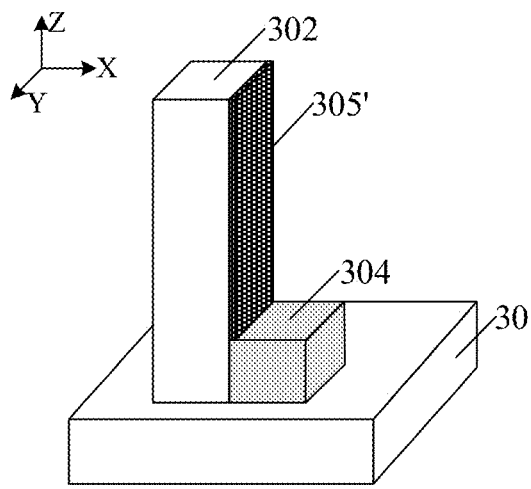

Next, referring to FIG. 3F and FIG. 3G, the operation S302 is performed to sequentially form a gate oxide layer and a gate on the sidewall of each of the transistor pillars.

In some embodiments, the method for manufacturing a transistor may further include the following operations before performing the operation S302.

In operation S10, a first isolation layer is formed by deposition at the bottom of the etched trench.

Here material of the first isolation layer includes but is not limited to any one of silicon nitride, silicon oxynitride, silicon carbide, or silicon dioxide.

Next, a transistor pillar on the wafer is taken as an example to illustrate the subsequent formation process. FIG. 3F illustrates a schematic structural diagram of forming a first isolation layer provided in an embodiment of the disclosure. As illustrated in FIG. 3F, a first isolation layer 304 is formed by deposition at the bottom of the etched trench (not illustrated in FIG. 3F). Here the first isolation layer may be formed by deposition with any suitable deposition process.

In some embodiments, the above operation of forming the gate oxide layer and the gate is performed after the first isolation layer is formed, and the operation of forming the gate oxide layer and the gate sequentially on the sidewall of each of the transistor pillars may include the following operations.

In operation S3021, an initial gate oxide layer is formed on the sidewall of each of the transistor pillars by in-situ oxidation.

FIG. 3G illustrates a schematic structural diagram of forming an initial gate oxide layer provided in an embodiment of the disclosure. As illustrated in FIGS. 3G and 3F, here the in-situ oxidation may be made on an exposed part of the sidewall 302-1' of the transistor pillar 301 by heating or pressurization to form an initial gate oxide layer 305'.

In operation S3022, a polysilicon material is deposited in the etched trench to form a polysilicon layer.

Here the polysilicon material may be deposited in the etched trench by a Chemical Vapor Deposition (CVD), Physical Vapor Deposition (PVD) or Atomic Layer Deposition (ALD) process to form the polysilicon layer, after the first isolation layer 304 is deposited.

In operation S3023, the initial gate oxide layer and the polysilicon layer are etched along the first direction, to remove part of the thicknesses of the initial gate oxide layer and the polysilicon layer in the first direction to form the gate oxide layer and the gate.

Figure 3H:
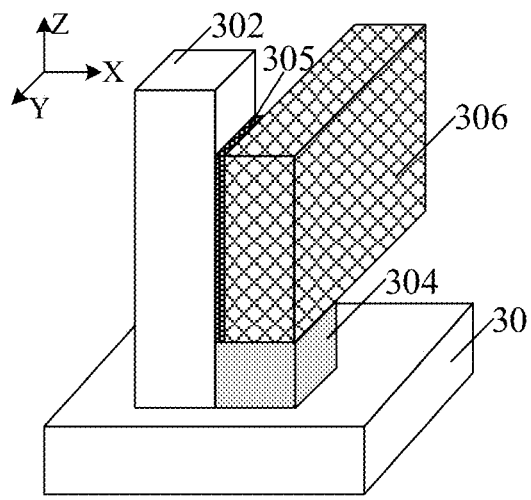

FIG. 3H illustrates a schematic structural diagram of forming a gate oxide layer and a gate provided in an embodiment of the disclosure. As illustrated in FIG. 3H, the initial gate oxide layer and the polysilicon layer as formed above are partially etched along the Z-axis direction, to obtain the gate oxide layer 305 and the gate 306. In the embodiments of the disclosure, a dry etching technique may be used to etch the initial gate oxide layer and the polysilicon layer.

In some embodiments, the method for manufacturing a transistor may further include the following operations after forming the gate oxide layer and the gate.

In operation S11, a second isolation layer is formed by deposition in the etched trench, here the second isolation layer is located within a projection region of the transistor pillar in the second direction, and a size of the second isolation layer in a third direction is equal to a size of the transistor pillar in the third direction.

In the embodiments of the disclosure, any two of the third direction, the second direction and the first direction are perpendicular to each other. It should be noted that in other embodiments, the third direction may not be perpendicular to the second direction, and the angle between the third direction and the second direction may be any angle.

Here material of the second isolation layer includes but is not limited to any one of silicon nitride, silicon oxynitride, silicon carbide or silicon dioxide; the material of the second isolation layer is the same as or different from the material of the first isolation layer.

Figure 3I:
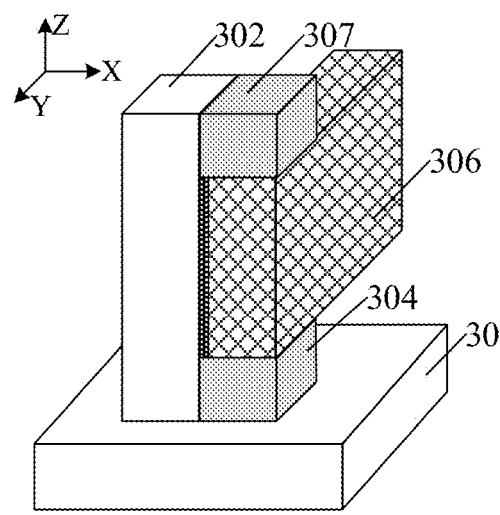

FIG. 3I illustrates a schematic structural diagram of forming a second isolation layer provided in an embodiment of the disclosure. As illustrated in FIG. 3I, the second isolation layer 307 is located within a projection region of the transistor pillar 302 in the X-axis direction, and a size of the second isolation layer in the Y-axis direction is equal to a size of the transistor pillar in the Y-axis direction.

Figure 3J:
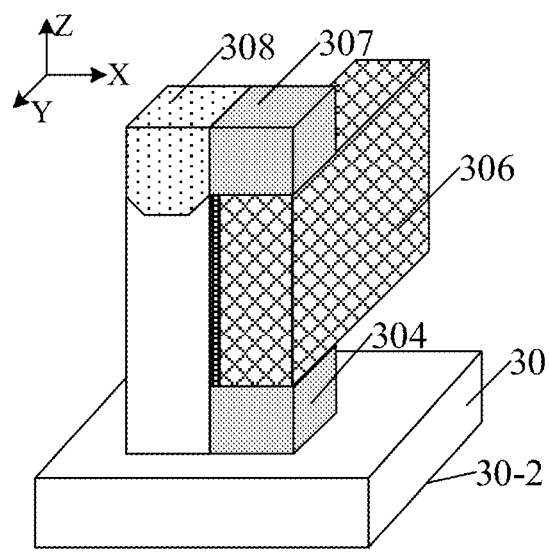

Next, referring to FIG. 3J, the operation S303 is performed to form a source at a first end of each of the transistor pillars.

Here the first end of each of the transistor pillars is an end of each of the transistor pillars in the Z-axis direction. FIG. 3J illustrates a schematic structural diagram of forming a source provided in an embodiment of the disclosure. As illustrated in FIG. 3J, the source 308 is formed by performing ion implantation on the first end of the transistor pillar.

In some embodiments, a shape of the source includes any one of a square, a semicircle, a triangle, or any polygon.

In some embodiments, the method for manufacturing a transistor may further include the following operations before performing the operation S304.

In operation S12, the wafer is thinned from a second surface of the wafer until exposing the first isolation layer and the second end of the transistor pillar.

Here please continue referring to FIG. 3J, the second surface 30-2 of the wafer is a surface opposite to the first surface of the wafer. In the embodiments of the disclosure, before the operation of thinning the second surface of the wafer is performed, the first surface of the wafer needs to be fixed onto a support structure to prevent the formed structure of the transistor from being damaged when the second surface 30-2 of the wafer is thinned.

Figure 3K:
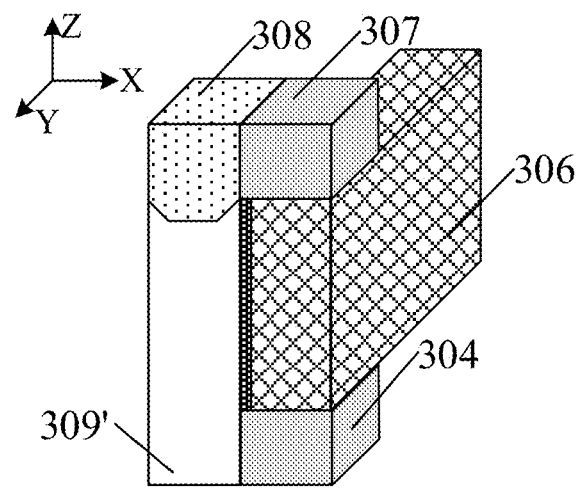

The first end and the second end are opposite ends of each of the transistor pillars in a first direction respectively. FIG. 3K illustrates a schematic structural diagram of a transistor after the second surface of the wafer is thinned, provided in an embodiment of the disclosure. As illustrated in FIG. 3K, the second surface of the wafer is thinned to expose the first isolation layer 304 and the second end 309' of the transistor pillar.

Figure 3L:
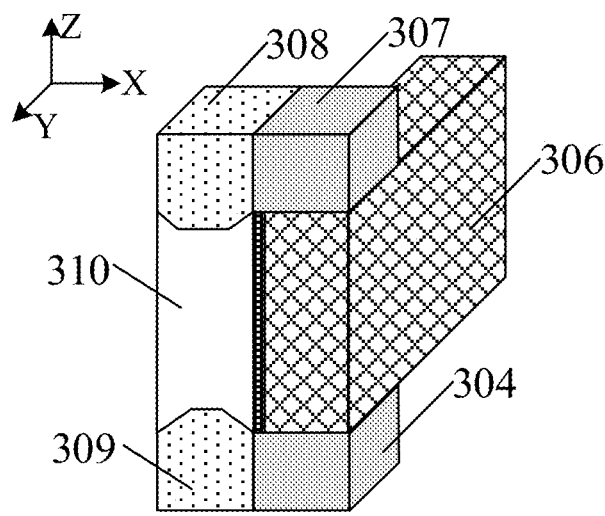

Next, referring to FIG. 3L, the operation S304 is performed to form a drain at a second end of each of the transistor pillars.

FIG. 3L illustrates a schematic structural diagram of forming a drain provided in an embodiment of the disclosure. As illustrated in FIG. 3L, the drain 309 is formed by performing ion implantation on the second end 309' of the transistor pillar.

In some embodiments, a shape of the drain includes any one of a square, a semicircle, a triangle, or any polygon.

Figure 3M:
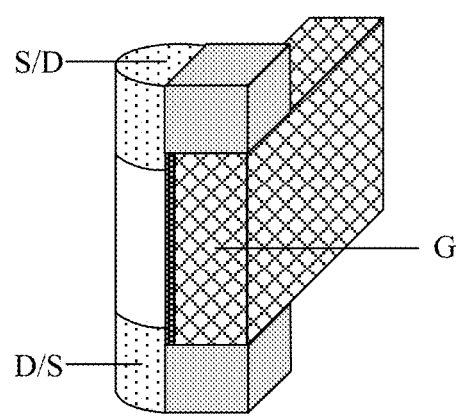
FIGS. 3M and 3N illustrate optional schematic structural diagrams of a columnar transistor provided in an embodiment of the disclosure.
Figure 3N:
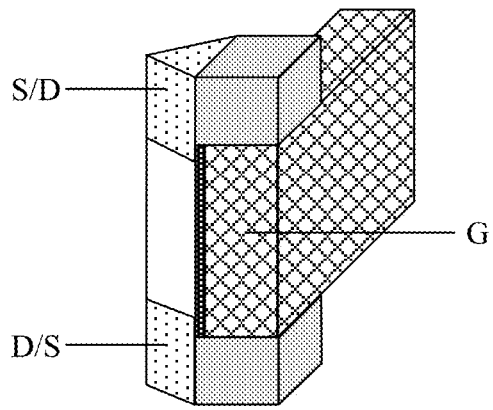

FIGS. 3M and 3N illustrate optional schematic structural diagrams of a columnar transistor provided in an embodiment of the disclosure. As illustrated in FIG. 3M, both cross-sectional shapes of the source and the drain of the columnar transistor are semicircular. As illustrated in FIG. 3N, both cross-sectional shapes of the source and the drain of the columnar transistor are triangular.

In the embodiments of the disclosure, positions of the source and the drain may be interchanged, and shapes of the source and the drain of the columnar transistor formed in the embodiments of the disclosure may be the same or different.

Please continue referring to FIG. 3L, in the embodiments of the disclosure, after the source and the drain are formed, a part of each of the transistor pillars between the source and the drain forms a channel region 310 of the transistor.

In the columnar transistor formed by the method for manufacturing a columnar transistor provided in the embodiments of the disclosure, since the source and the drain are located at the first end and the second end of the channel region in the first direction respectively, and the first direction is the thickness direction of the wafer forming the channel region, the area of the transistor is greatly reduced.

In some embodiments, when the columnar transistor provided in the embodiments of the disclosure is applied to a memory, since the drain and the source of the columnar transistor are located on different surfaces of the wafer, different structures of the memory connected to the source and the drain may be designed on two surfaces of the wafer respectively, thereby simplifying the circuit layout inside the memory and reducing difficulty of the process of manufacturing the memory.

The transistor provided in the embodiments of the disclosure may further include an L-shaped transistor, and the L-shaped transistor may be formed by the method for manufacturing a transistor provided in the following embodiments.

Figure 4A:
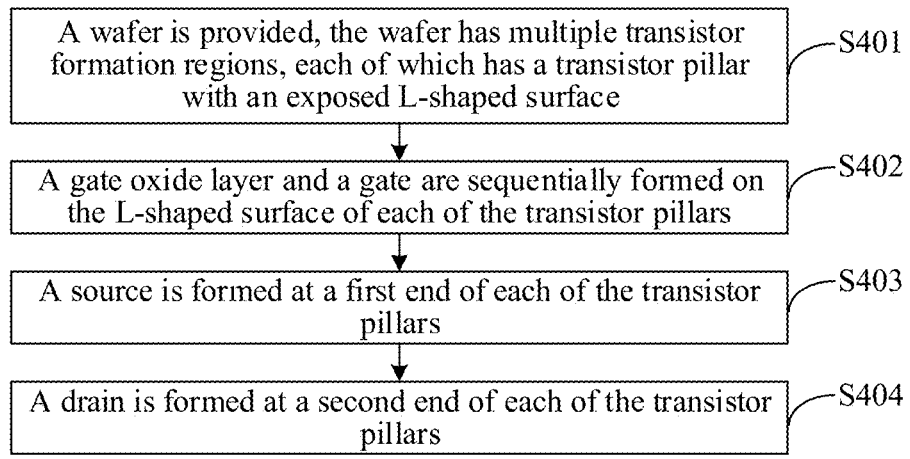
FIG. 4A illustrates an optional schematic flowchart of a method for manufacturing an L-shaped transistor provided in an embodiment of the disclosure.

FIG. 4A illustrates an optional schematic flowchart of the method for manufacturing an L-shaped transistor provided in an embodiment of the disclosure. As illustrated in FIG. 4A, the method for manufacturing an L-shaped transistor includes the following operations.

In operation S401, a wafer is provided, the wafer has multiple transistor formation regions, each of which has a transistor pillar with an exposed L-shaped surface.

In operation S402, a gate oxide layer and a gate are sequentially formed on the L-shaped surface of each of the transistor pillars.

In operation S403, a source is formed at a first end of each of the transistor pillars.

In operation S404, a drain is formed at a second end of each of the transistor pillars.

Here the first end and the second end are opposite ends of each of the transistor pillars in a first direction respectively, and have different sizes in a second direction; the first direction is a thickness direction of the wafer and is perpendicular to the second direction; a part of each of the transistor pillars between the source and the drain forms a channel region of the transistor.

Figure 4B:
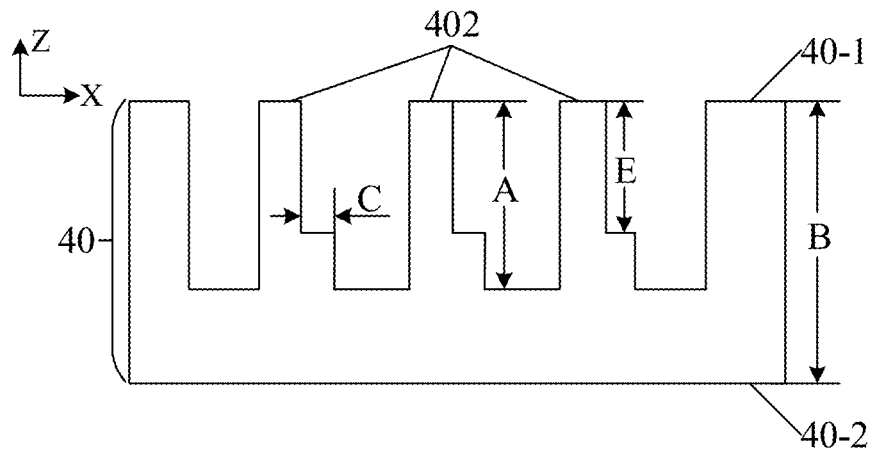
FIGS. 4B to 4J illustrate schematic structural diagrams of a process of forming an L-shaped transistor provided in an embodiment of the disclosure.
Figure 4C:
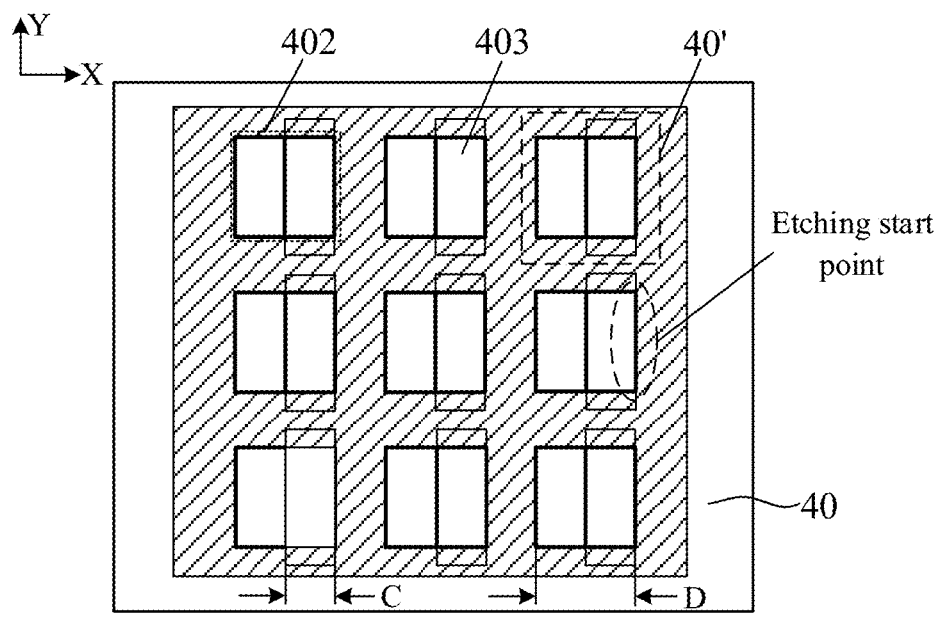
Figure 4D:
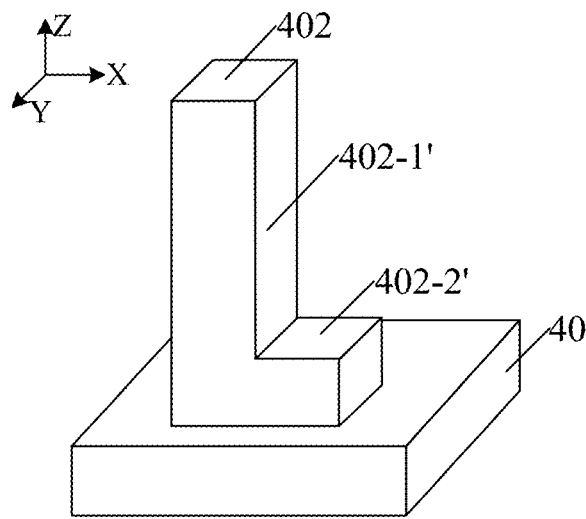

Next, referring to FIGS. 4B to 4D, the method for manufacturing an L-shaped transistor provided in the embodiment of the disclosure will be further described in detail.

In the embodiment of the disclosure, each of the transistor formation regions is a region on the wafer for forming the transistor, each of the transistor formation regions has a transistor pillar with an exposed L-shaped surface. Each of the transistor formation regions may further have an insulating layer surrounding sidewalls of each of the transistor pillars.

In the embodiment of the disclosure, the process of forming the transistor formation region is the same as the process of forming the transistor region in the above embodiments, and will not be elaborated here.

FIG. 4B illustrates a cross-sectional view of a transistor pillar along a first direction provided in an embodiment of the disclosure, and FIG. 4C illustrates a top view of a transistor pillar provided in an embodiment of the disclosure. As may be seen in combination of FIGS. 4B and 4C, the wafer forming the silicon pillar has a first surface 40-1 and a second surface 40-2 opposite to each other, and the first surface 40-1 is any surface of the wafer along the Z-axis direction. Each of the silicon pillars and the insulating layer are etched along the X-axis direction with a position of an edge of each of the silicon pillars as an etching start point, to remove the silicon pillar and the insulating layer with a preset size C in the X-axis direction and with a second preset thickness E in the Z-axis direction, to form the transistor pillar 402 and an etched trench 403, thereby forming a transistor formation region 40' in the wafer 40. In the embodiments of the disclosure, the preset size C is smaller than an initial size D of the silicon pillar in the X-axis direction, the second preset thickness E is smaller than the first preset thickness A which is smaller than an initial thickness B of the wafer in the Z-axis direction.

It should be noted that the insulating material filling around each of the silicon pillars is not illustrated in FIG. 4B, for ease of understanding.

FIG. 4D illustrates a perspective view of a transistor pillar provided in an embodiment of the disclosure. It may be seen from FIG. 4D that the transistor pillar 402 has an L-shaped surface. The L-shaped surface includes a vertical surface 402-1' and a horizontal surface 402-2' perpendicular to the vertical surface.

It should be noted that many transistors may be formed on a wafer. Therefore, there are multiple transistor formation regions on a wafer. In the embodiments of the disclosure, only a limited number of transistor formation regions are shown as an example, for ease of description.

Figure 4E:
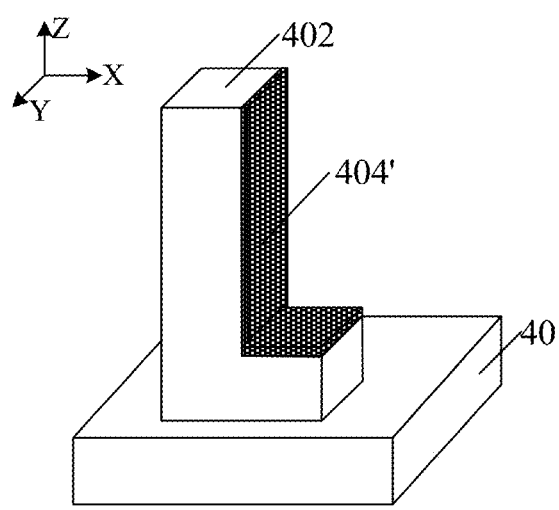
Figure 4F:
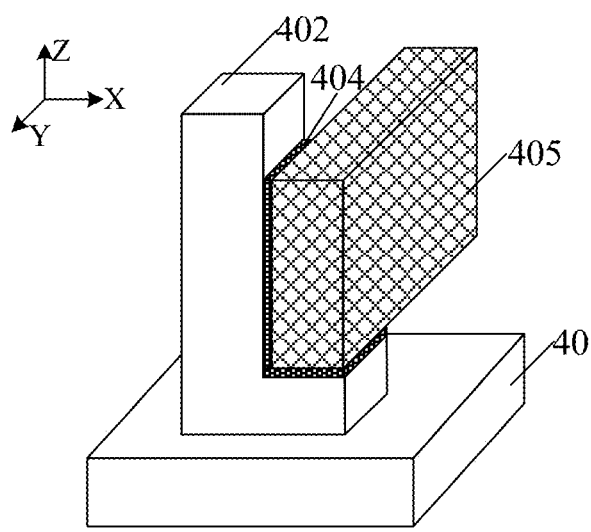

Next, referring to FIGS. 4E and 4F, the operation S402 is performed to sequentially form a gate oxide layer and a gate on the sidewall of each of the transistor pillars.

In some embodiments, the operation of forming the gate oxide layer and the gate sequentially on the L-shaped surface of each of the transistor pillars may include the following operations.

In operation S4021, an initial gate oxide layer is formed on each of the vertical surface and the horizontal surface by in-situ oxidation.

As illustrated in FIG. 4E which illustrates a schematic structural diagram of forming an initial gate oxide layer provided in an embodiment of the disclosure. Here the in-situ oxidation may be made on the horizontal surface 402-2' and the vertical surface 402-1' by heating or pressurization to form an initial gate oxide layer 404'.

In operation S4022, a polysilicon material is deposited in the etched trench having the initial gate oxide layer to form a polysilicon layer.

In operation S4023, the initial gate oxide layer and the polysilicon layer are etched along the first direction, to remove part of the thicknesses of the initial gate oxide layer and the polysilicon layer in the first direction to form the gate oxide layer and the gate.

FIG. 4F illustrates a schematic structural diagram of forming a gate oxide layer and a gate provided in an embodiment of the disclosure. As illustrated in FIG. 4F, the initial gate oxide layer and the polysilicon layer as formed above are partially etched along the Z-axis direction, to obtain the gate oxide layer 404 and the gate 405. In the embodiments of the disclosure, a dry etching technique may be used to etch the initial gate oxide layer and the polysilicon layer.

In some embodiments, the method for manufacturing an L-shaped transistor may further include the following operations after forming the gate oxide layer and the gate.

In operation S20, an isolation layer is formed by deposition in the etched trench, here the isolation layer is located within a projection region of the transistor pillar in the second direction, and a size of the isolation layer in a third direction is equal to a size of the transistor pillar in the third direction.

In the embodiments of the disclosure, any two of the third direction, the second direction and the first direction are perpendicular to each other. It should be noted that in other embodiments, the third direction may not be perpendicular to the second direction, and the angle between the third direction and the second direction may be any angle.

Here material of the isolation layer includes but is not limited to any one of silicon nitride, silicon oxynitride, silicon carbide or silicon dioxide.

Figure 4G:
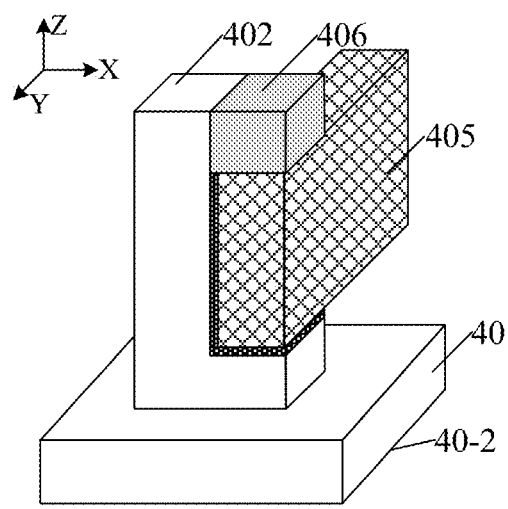

FIG. 4G illustrates a schematic structural diagram of forming an isolation layer provided in an embodiment of the disclosure. As illustrated in FIG. 4G, the isolation layer 406 is located within a projection region of the transistor pillar 402 in the X-axis direction, and a size of the isolation layer in the Y-axis direction is equal to a size of the transistor pillar in the Y-axis direction.

Figure 4H:
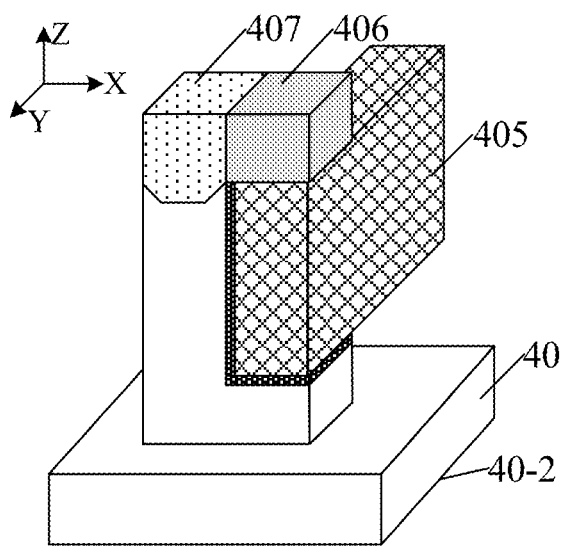

Next, referring to FIG. 4H, the operation S403 is performed to form a source at a first end of each of the transistor pillars.

Here the first end of each of the transistor pillars is an end of each of the transistor pillars in the Z-axis direction. FIG. 4H illustrates a schematic structural diagram of forming a source provided in an embodiment of the disclosure. As illustrated in FIG. 4H, the source 407 is formed by performing ion implantation on the first end of the transistor pillar.

In some embodiments, a shape of the source includes any one of a square, a semicircle, a triangle, or any polygon.

In some embodiments, the method for manufacturing a transistor may further include the following operations before performing the operation S404.

In operation S21, the wafer is thinned from a second surface of the wafer to remove a part of the wafer with a third preset thickness and expose the second end of the transistor pillar.

Here please continue referring to FIG. 4H, the second surface 40-2 of the wafer is a surface opposite to the first surface of the wafer. The third preset thickness is smaller than a difference between the initial thickness of the wafer and the second preset thickness. That is, in the embodiments of the disclosure, when silicon on the second surface of the first wafer is thinned, it is necessary to ensure that a thickness of silicon remains at the bottom of the etched trench.

In other embodiments, before the operation of thinning the second surface of the wafer is performed, the first surface of the wafer needs to be fixed onto a support structure to prevent the formed structure of the transistor from being damaged when the second surface 40-2 of the wafer is thinned.

Figure 4I:
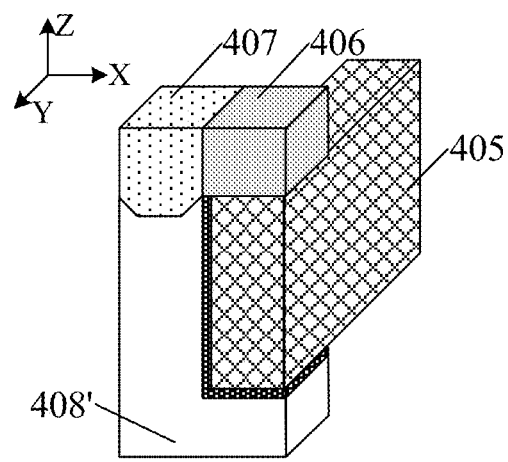

The first end and the second end are opposite ends of each of the transistor pillars in a first direction respectively. FIG. 4I illustrates a schematic structural diagram of a transistor after the second surface of the wafer is thinned, provided in an embodiment of the disclosure. As illustrated in FIG. 4I, the second surface of the wafer is thinned to remove a part of the wafer with a third preset thickness and expose the second end 408' of the transistor pillar.

Figure 4J:
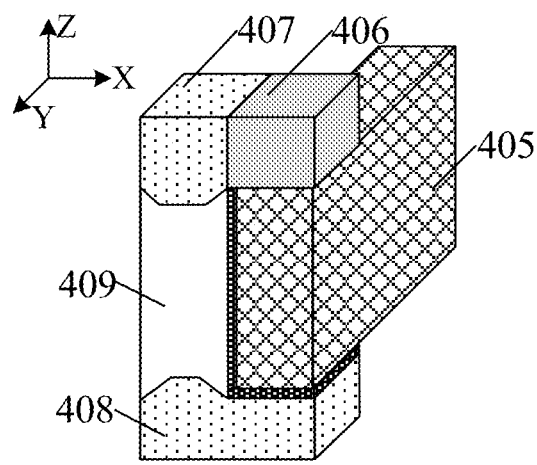

Next, referring to FIG. 4J, the operation S404 is performed to form a drain at a second end of each of the transistor pillars.

In some embodiments, the operation of forming the drain at the second end of the transistor pillar may include the following operations. Ion implantation is performed on the second end of the transistor pillar to a preset depth to form the drain, here the preset depth is smaller than or equal to the difference between the initial thickness and the second preset thickness.

Here the depth of performing ion implantation on the drain may be a preset depth set in advance, and a maximum value of the preset depth may be equal to the difference between the initial thickness of the wafer and the second preset thickness.

In the embodiments of the disclosure, when a part of the wafer with a third preset thickness is thinned and removed, and the third preset thickness is the difference between the initial thickness and the first preset thickness, a maximum implantation depth when the drain is formed at the second end of the transistor pillar is a difference between the first preset thickness and the second preset thickness. FIG. 4J illustrates an optional schematic structural diagram of forming a drain provided in an embodiment of the disclosure. As illustrated in FIG. 4J, ion implantation is performed on the second end 408' of the transistor pillar to a preset depth to form the drain 408. Here, the preset depth is equal to the difference between the first preset thickness and the second preset thickness, furthermore, a vertical channel region 409 is formed between the source 407 and the drain 408.

In some embodiments, a shape of the drain includes any one of a square, a semicircle, a triangle, or any polygon.

In the embodiments of the disclosure, the finally formed transistor is an L-shaped transistor from an overall view point, that is, the source, the drain, and the channel region of the transistor form an L-shaped structure together.

Figure 4K:
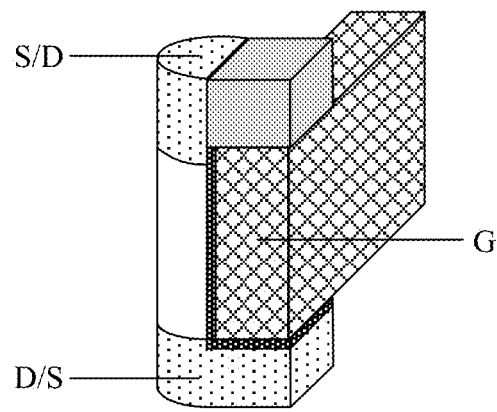
FIGS. 4K and 4L illustrate optional schematic structural diagrams of an L-shaped transistor provided in an embodiment of the disclosure.
Figure 4L:
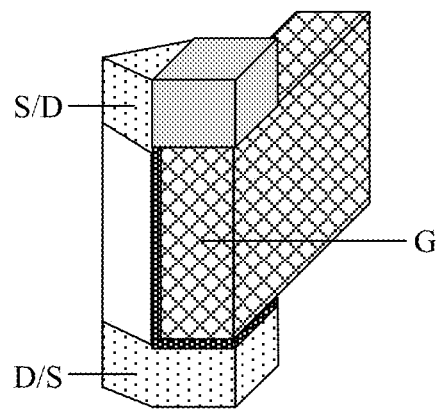

FIGS. 4K and 4L are optional schematic structural diagrams of an L-shaped transistor provided in an embodiment of the disclosure. As illustrated in 4K, both cross-sectional shapes of the source and the drain of the L-shaped transistor are semicircular. As illustrated in FIG. 4L, both cross-sectional shapes of the source and the drain of the L-shaped transistor are triangular.

In the embodiments of the disclosure, positions of the source and the drain may be interchanged, that is, the source may be formed firstly or the drain may be formed firstly, and shapes of the source and the drain of the L-shaped transistor formed in the embodiments of the disclosure may be the same or different.

In the L-shaped transistor formed by the method for manufacturing an L-shaped transistor provided in the embodiments of the disclosure, since the source and the drain are located at the first end and the second end of the channel region in the first direction respectively, and the first direction is the thickness direction of the wafer forming the channel region, the area of the transistor is greatly reduced.

In some embodiments, when the L-shaped transistor provided in the embodiments of the disclosure is applied to a memory, since the drain and the source of the L-shaped transistor are located on different surfaces of the wafer, different structures of the memory connected to the source and the drain may be designed on two surfaces of the wafer respectively, thereby simplifying the circuit layout inside the memory and reducing difficulty of the process of manufacturing the memory.

Figure 5A:
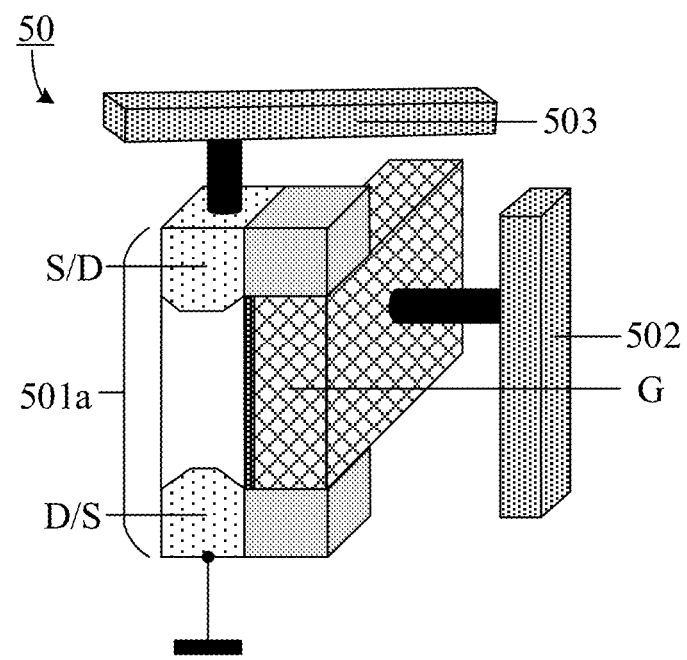
FIGS. 5A and 5B illustrate optional schematic structural diagrams of a semiconductor device provided in an embodiment of the disclosure.
Figure 5B:
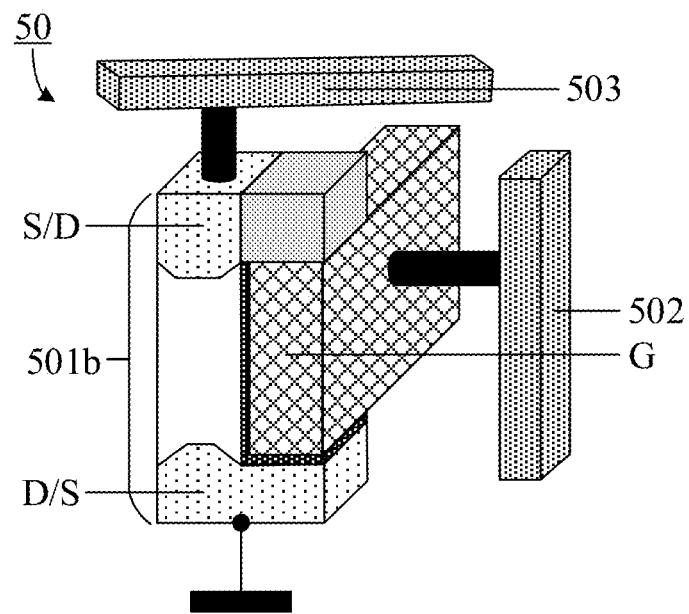

Embodiments of the disclosure provide a semiconductor device. FIGS. 5A and 5B illustrate optional schematic structural diagrams of a semiconductor device provided in an embodiment of the disclosure. As illustrated in FIGS. 5A and 5B, the semiconductor device 50 includes at least one memory cell, a word line 502 and a bit line 503.

Here each of the at least one memory cell includes at least one transistor, such as a columnar transistor 501a or an L-shaped transistor 501b. The columnar transistor 501a or the L-shaped transistor 501b includes at least a gate G, a source S and a drain D.

The columnar transistor 501a or the L-shaped transistor 501b further includes a channel region, and the source of the columnar transistor is located at a first end of the channel region; the drain of the columnar transistor is located at a second end of the channel region; here the first end and the second end are opposite ends of the channel region in a first direction which is a thickness direction of a wafer forming the channel region.

In the embodiment of the disclosure, the columnar transistor 501a or the L-shaped transistor 501b has a vertical channel, and the source and the drain of the columnar transistor 501a are located at two ends of the vertical channel respectively.

In the embodiment of the disclosure, the word line 502 is connected to the gate G of the columnar transistor 501a, and is configured to provide a word line voltage and control the columnar transistor 501a to be turned on or off by the word line voltage; or, the word line 502 is connected to the gate G of the L-shaped transistor 501b, and is configured to provide a word line voltage and control the L-shaped transistor 501b to be turned on or off by the word line voltage.

The bit line 503 is connected to the source S or the drain D of the columnar transistor 501a, and is configured to perform a read or write operation on each of the at least one memory cell when the columnar transistor is turned on; or, the bit line 503 is connected to the source S or the drain D of the L-shaped transistor 501b, and is configured to perform a read or write operation on each of the at least one memory cell when the columnar transistor is turned on.

In some embodiments, when the source S of the columnar transistor 501a is connected to the bit line 503, the drain of the columnar transistor is grounded; when the drain of the columnar transistor 501a is connected to the bit line 503, the source of the columnar transistor is grounded; or, when the source S of the L-shaped transistor 501b is connected to the bit line 503, the drain of the L-shaped transistor is grounded; when the drain of the L-shaped transistor 501b is connected to the bit line 503, the source of the L-shaped transistor is grounded.

The semiconductor device provided in the embodiments of the disclosure includes various types of memories. For example, it includes NAND flash, Nor Flash, DRAM, Static Random Access Memory (SRAM), PCM, Ferroelectric Random Access Memory (FRAM), Magneto-resistive Random Access Memory (MRAM) or Resistive Random Access Memory (PCRAM).

In some embodiments, when the semiconductor device is a DRAM, the memory cell further includes a storage capacitor.

Figure 5C:
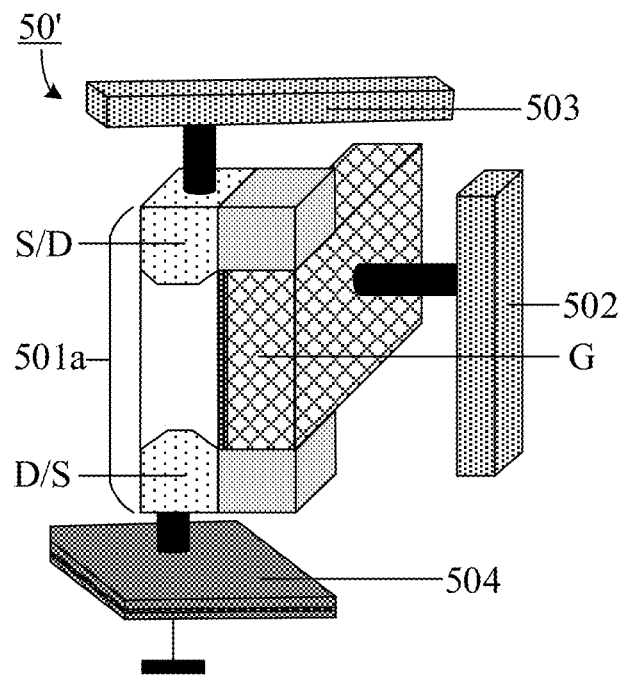
FIGS. 5C and 5D illustrate optional schematic structural diagrams of a DRAM memory cell provided in an embodiment of the disclosure.
Figure 5D:
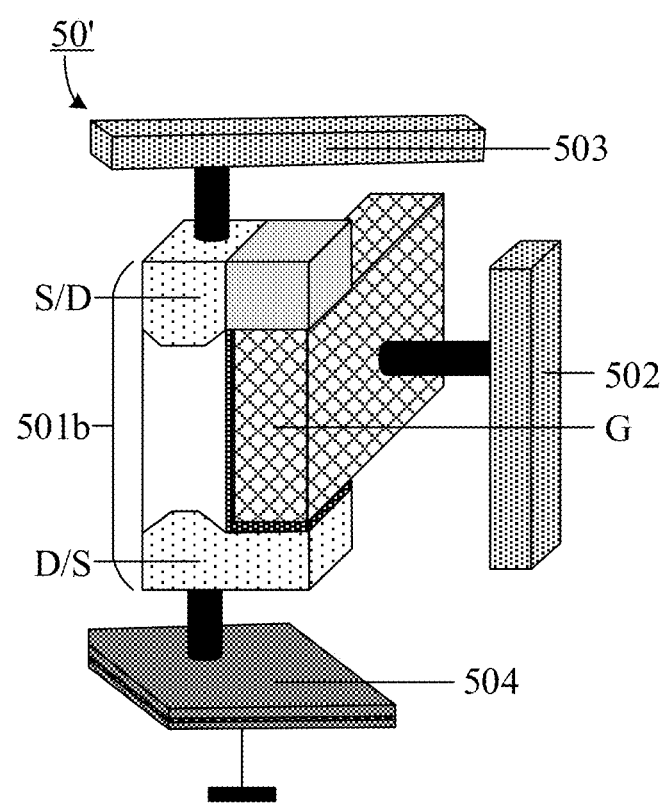

As illustrated in FIGS. 5C and 5D which are optional schematic structural diagrams of a DRAM memory cell provided in an embodiment of the disclosure, it may be seen that in the DRAM memory cell 50', the storage capacitor 504 has one end connected to the drain or the source of the columnar transistor 501a or connected to the drain or the source of the L-shaped transistor 501b, and the other end grounded, and the storage capacitor 504 is configured to store data written in each of the at least one memory cell.

In some embodiments, when the semiconductor device is a PCM, each of the at least one memory cell further includes an adjustable resistor.

Figure 5E:
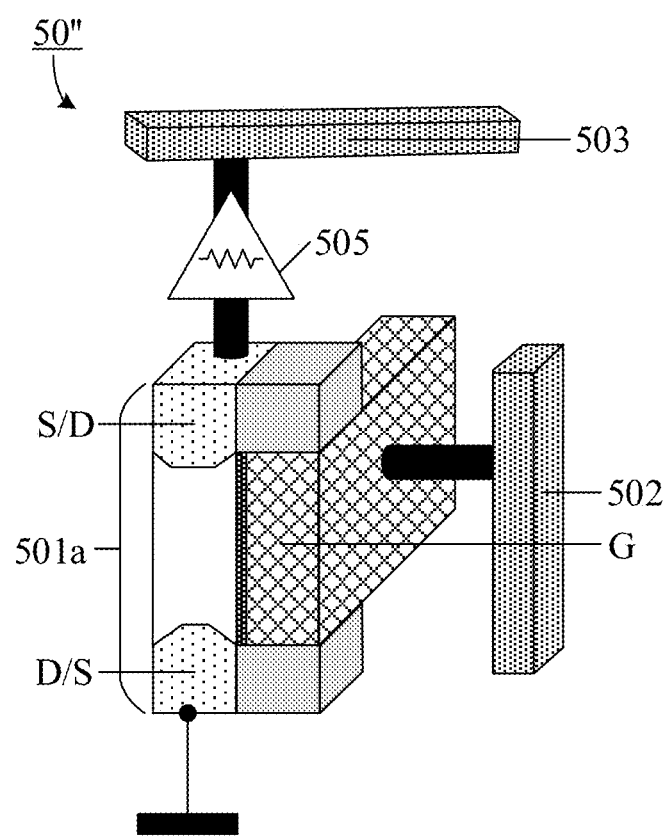
FIGS. 5E and 5F illustrate optional schematic structural diagrams of a Phase-Change Memory (PCM) memory cell provided in an embodiment of the disclosure.
Figure 5F:
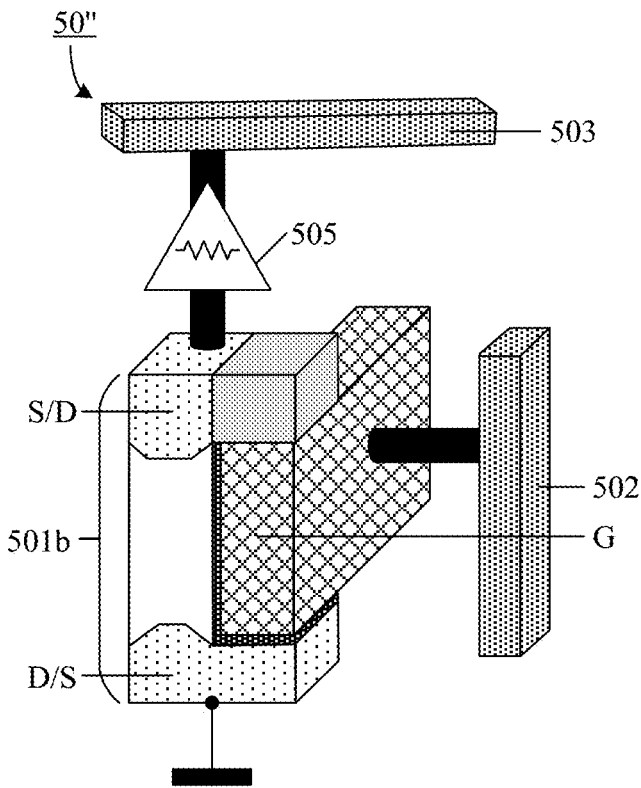

As illustrated in FIGS. 5E and 5F which are optional schematic structural diagrams of a PCM memory cell provided in an embodiment of the disclosure, it can be seen that in the PCM memory cell 50'', the adjustable resistor 505 is connected between the bit line 503 and the source or the drain of the columnar transistor 501a, or the adjustable resistor 505 is connected between the bit line 503 and the source or the drain of the L-shaped transistor 501b, and the adjustable resistor 505 is configured to adjust a state of data stored in each of the at least one memory cell by a bit line voltage provided by the bit line.

In some embodiments, when the semiconductor device includes multiple memory cells, the semiconductor device is a NAND Flash or a Nor Flash. When the multiple memory cells are connected in parallel, the semiconductor device is a Nor Flash; when the multiple memory cells are connected in series, the semiconductor device is a NAND Flash.

In the embodiments of the disclosure, only some common semiconductor devices are listed as an example, and the protection scope of the disclosure is not limited thereto. Any semiconductor device including the columnar transistor provided in the embodiments of the disclosure belongs to the protection scope of the disclosure.

In the embodiments of the disclosure, by designing the structure of the transistor of the semiconductor device as a novel structure with a vertical channel, the area of the memory cell is reduced and the storage density of the memory cell is improved. Furthermore, the source and the drain of the columnar transistor according to the embodiments of the disclosure are located at the upper and lower ends of the vertical channel region. Thus, during formation of the semiconductor device, the bit line or other structures may be arranged on vertical surfaces of the channel region respectively. For example, for a DRAM, the bit line and the capacitor of the DRAM memory cell may be arranged on two surfaces of the same wafer respectively. In this way, the circuit arrangement of the word line, the bit line and the capacitor may be simplified, difficulty of the process of manufacturing the semiconductor device is reduced.

Figure 6:
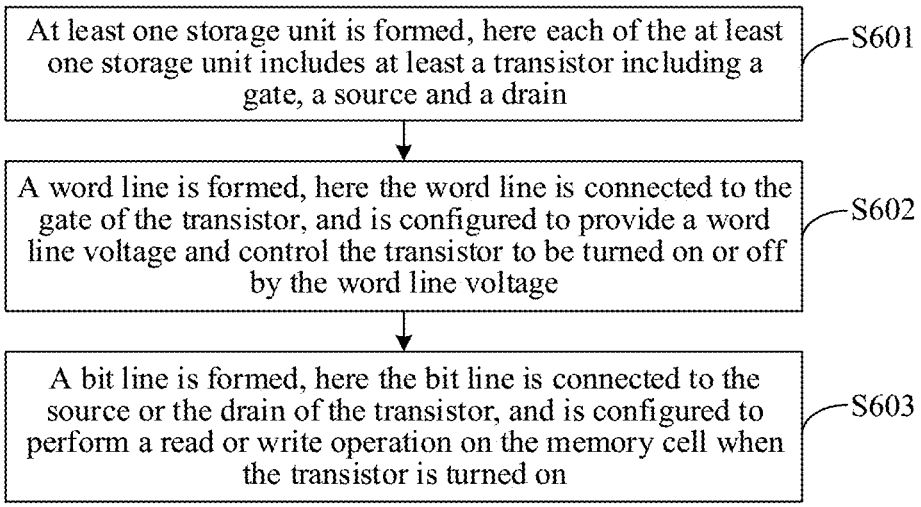
FIG. 6 illustrates an optional schematic structural diagram of a method for forming a semiconductor device provided in an embodiment of the disclosure.

In addition, embodiments of the disclosure further provide a method for forming a semiconductor device. FIG. 6 illustrates an optional schematic structural diagram of a method for forming a semiconductor device provided in an embodiment of the disclosure. As illustrated in FIG. 6, the method may include the following operations.

In operation S601, at least one memory cell is formed, here each of the at least one memory cell includes at least a transistor including a gate, a source and a drain.

In the embodiment of the disclosure, the transistor includes a columnar transistor or an L-shaped transistor.

In operation S602, a word line is formed, here the word line is connected to the gate of the transistor, and is configured to provide a word line voltage and control the transistor to be turned on or off by the word line voltage.

In operation S603, a bit line is formed, here the bit line is connected to the source or the drain of the transistor, and is configured to perform a read or write operation on each of the at least one memory cell when the transistor is turned on.

In some embodiments, the columnar transistor in the memory cell is formed by the following operations.

In operation S6011, a thickness (corresponding to the first preset thickness in the above embodiments) of silicon is removed from a part of the region of the first surface of the first wafer by an etching process, to form a grid-like trench with silicon pillars in the middle (corresponding to the grid-like etched trench in the above embodiments), the trench is filled with silicon dioxide (corresponding to the insulating layer in the above embodiments), and then the surface of the silicon pillar is exposed by a CMP process, finally a part of the silicon pillar is removed by etching, and the sidewall of the silicon pillar is exposed (corresponding to the process of forming the transistor pillar in the above embodiments).

In operation S6012, silicon nitride is formed at the bottom of the trench to be used as a spacer structure at the bottom (corresponding to the formation of the first isolation layer in the above embodiments).

In operation S6013, silicon oxide is formed by in-situ growth on the sidewall of the trench to be used as a gate oxide layer (corresponding to the formation of the initial gate oxide layer in the above embodiments).

In operation S6014, the trench is filled with polysilicon (corresponding to the formation of the polysilicon layer in the above embodiments), and a depth of polysilicon at the top is removed by etching, and then the exposed silicon oxide at the top is removed (corresponding to the operation S3023 in the above embodiments).

In operation S6015, silicon nitride is formed at the top of the trench to be used as a spacer structure at the top (corresponding to the formation of the second isolation layer in the above embodiments).

In operation S6016, a source terminal is formed in the transistor region reserved in the operation S6011 (corresponding to the first end of the transistor pillar in the above embodiments) by ion implantation.

In operation S6017, subsequent corresponding structures are formed on the first surface of the first wafer through various processes, and then the first wafer are bonded to the second wafer, finally silicon on the back surface of the first wafer is thinned until the spacer structure at the bottom and the second surface of the first wafer are exposed (corresponding to the operation S12 in the above embodiments).

Here the subsequent corresponding structure includes a structure of forming a bit line, a resistor, or a capacitor, etc. Various logic circuits, sensors and other components are arranged in the second wafer, and the second wafer and the first wafer are bonded together to form a memory.

In some embodiments, the process of wafer bonding is implemented before the process of thinning silicon at the back surface, and the second wafer provides support for the first wafer during the thinning process to prevent the first wafer from being damaged during the thinning process.

In operation S6018, a drain is formed on the second surface of the first wafer, at a position opposite to the source in the operation S5016 (corresponding to the second end of the above transistor pillar) by ion implantation.

Finally, in operation S6019, subsequent corresponding structures are formed on the second surface of the first wafer.

Here the subsequent corresponding structure includes a structure of forming a bit line, a resistor, or a capacitor, etc.

In some embodiments, the L-shaped transistor in the memory cell is formed by the following operations.

In operation S7011, a thickness (corresponding to the first preset thickness in the above embodiments) of silicon is removed from a part of the region of the first surface of the first wafer by an etching process, to form a grid-like trench with silicon pillars in the middle (corresponding to the grid-like etched trench in the above embodiments), the trench is filled with silicon dioxide (corresponding to the insulating layer in the above embodiments), and then the surface of the silicon pillar is exposed by a CMP process, finally a part of the silicon pillar is removed by etching, to form an exposed L-shaped surface (corresponding to the process of forming the transistor pillar in the above embodiments).

In operation S7012, silicon oxide is formed by in-situ growth on the sidewall and the bottom of the trench to be used as a gate oxide layer (corresponding to the formation of the initial gate oxide layer in the above embodiments).

In operation S7013, the trench is filled with polysilicon (corresponding to the formation of the polysilicon layer in the above embodiments), and a depth of polysilicon at the top is removed by etching, and then the exposed silicon oxide at the top is removed (corresponding to the operation S4023 in the above embodiments).

In operation S7014, silicon nitride is formed at the top of the trench to be used as a spacer structure at the top (corresponding to the formation of the isolation layer in the above embodiments).

In operation S7015, a source terminal is formed in the transistor region reserved in the operation S7011 (corresponding to the first end of the transistor pillar in the above embodiments) by ion implantation.

In operation S7016, subsequent corresponding structures are formed on the first surface of the first wafer through various processes, and then the first wafer are bonded to the second wafer, finally silicon on the back surface of the first wafer is thinned to ensure that a thickness of silicon remains in the region of the trench (corresponding to the etched trench in the above embodiments) and expose the second surface of the first wafer (corresponding to the operation S21 in the above embodiments).

Here the subsequent corresponding structure includes a structure of forming a bit line, a resistor, or a capacitor, etc. Various logic circuits, sensors and other components are arranged in the second wafer, and the second wafer and the first wafer are bonded together to form a memory.

In some embodiments, the process of wafer bonding is implemented before the process of thinning silicon at the back surface, and the second wafer provides support for the first wafer during the thinning process to prevent the first wafer from being damaged during the thinning process.

In operation S7017, a drain is formed on the second surface of the first wafer, at a position opposite to the source in the operation S5015 (corresponding to the second end of the above transistor pillar) by ion implantation.

Finally, in operation S7018, subsequent corresponding structures are formed on the second surface of the first wafer.

Here the subsequent corresponding structure includes a structure of forming a bit line, a resistor, or a capacitor, etc.

According to the method for forming a semiconductor device provided in the embodiments of the disclosure, the horizontal cross-section of the formed columnar transistor or L-shaped transistor may be rectangular (square), semicircular, triangular, or any polygon. In the semiconductor device according to the embodiments of the disclosure, the source and the drain of the columnar transistor or the L-shaped transistor may be interchanged, and the source and the drain may be processed on both surfaces of the same wafer respectively. Therefore, the patterns of the source and the drain may be different.

In the embodiments of the disclosure, the word line and the bit line are implemented by forming metal lines at a preset word line position and a preset bit line position. The metal wire includes but is not limited to wolfram (W), cobalt (Co), copper (Cu), aluminum (Al), polysilicon, doped silicon, silicide, or any combination thereof.

In the embodiments of the disclosure, by designing the structure of the transistor of the semiconductor device as a novel structure with a vertical channel, the area of the memory cell is reduced and the storage density of the memory cell is improved. Furthermore, the source and the drain of the transistor according to the embodiments of the disclosure are located at the upper and lower ends of the vertical channel region. Thus, during formation of the semiconductor device, in combination with technologies of wafer bonding and thinning silicon at the back surface, the bit line or other structures may be arranged on opposite surfaces of the wafer respectively. For example, for a DRAM, the bit line and the capacitor of the DRAM memory cell may be arranged on two surfaces of the same wafer respectively. In this way, the circuit arrangement of the word line, the bit line and the capacitor may be simplified, difficulty of the process of manufacturing the semiconductor device is reduced.

In several embodiments provided in the disclosure, it should be understood that the disclosed devices and methods may be implemented in a non-target manner. The above device embodiments are merely illustrative. For example, the division of units is only a logical function division, and there may be other divisions in actual implementation, for example, multiple units or components may be combined, or may be integrated into another system, or some features may be ignored or not implemented. In addition, the components as shown or discussed are coupled to each other or directly coupled.

The above units described as separate components may be or may not be physically separate, and the components displayed as units may be or may not be physical units, that is, they may be located at one place or distributed on multiple network units; some or all of the units may be selected according to actual needs to achieve the purpose of the solutions of the embodiments.

The features disclosed in several method or device embodiments provided in the disclosure may be combined arbitrarily without conflict to obtain a new method or device embodiment.

The above are only some implementations of the disclosure, but the protection scope of the disclosure is not limited thereto. Any person skilled in the art may easily conceive of changes or substitutions within the technical scope disclosed in the disclosure, and these changes or substitutions should fall within the protection scope of the disclosure. Therefore, the protection scope of the disclosure shall be subject to the protection scope of the claims.

INDUSTRIAL APPLICABILITY

Embodiments of the disclosure provide a transistor and a method for manufacturing the same, a semiconductor device and a method for manufacturing the same. The method for manufacturing a transistor includes the following operations. A wafer is provided, the wafer has multiple transistor formation regions, each of which has a transistor pillar with an exposed gate formation surface. A gate oxide layer and a gate are sequentially formed on the gate formation surface of each of the transistor pillars. A source is formed at a first end of each of the transistor pillars. A drain is formed at a second end of each of the transistor pillars, here the first end and the second end are opposite ends of each of the transistor pillars in a first direction which is a thickness direction of the wafer; a part of each of the transistor pillars between the source and the drain forms a channel region of the transistor.

The invention claimed is:

1. A method for manufacturing a transistor, comprising:
providing a wafer having a plurality of transistor formation regions, each of which having a transistor pillar with an exposed gate formation surface;
forming a gate oxide layer and a gate sequentially on the gate formation surface of each of the transistor pillars;
forming a source by performing ion implantation on a first end of each of the transistor pillars; and
thinning the wafer until a second end of each of the transistor pillars is exposed, and forming a drain by performing ion implantation on the second end of each of the transistor pillars, wherein the first end and the second end are opposite ends of each of the transistor pillars in a first direction which is a thickness direction of the wafer; a part of each of the transistor pillars between the source and the drain forms a channel region of the transistor.

2. The method of claim 1, wherein the gate formation surface comprises a sidewall or an L-shaped surface;
the forming the gate oxide layer and the gate sequentially on the gate formation surface of each of the transistor pillars comprises:
forming the gate oxide layer and the gate sequentially on the sidewall of each of the transistor pillars; or,
forming the gate oxide layer and the gate sequentially on the L-shaped surface of each of the transistor pillars.

3. The method of claim 2, wherein each of the transistor formation regions further has an insulating layer surrounding other sidewalls of each of the transistor pillars; each of the transistor formation regions is formed by:
partially etching the wafer along the first direction with a first surface of the wafer as an etching start point, to form a grid-like etched trench composed of a plurality of silicon pillars, wherein each of the silicon pillars has a first preset thickness which is smaller than an initial thickness of the wafer, and the first surface of the wafer is any surface of the wafer along the first direction;
depositing an insulating material in the grid-like etched trench to form an insulating layer surrounding each of the silicon pillars; and
etching each of the silicon pillars and the insulating layer to form the transistor pillar having an exposed sidewall or an exposed L-shaped surface, to obtain the transistor formation region.

4. The method of claim 3, wherein the etching each of the silicon pillars and the insulating layer to form the transistor pillar having the exposed sidewall comprises:
partially etching each of the silicon pillars and the insulating layer along the first direction with a position of an edge of each of the silicon pillars as an etching start point, to remove the silicon pillar and the insulating layer with a preset size in a second direction and with the first preset thickness in the first direction, to form the transistor pillar having the exposed sidewall and form an etched trench, wherein the preset size is smaller than an initial size of each of the silicon pillars in the second direction which is perpendicular to the first direction.

5. The method of claim 4, further comprising before forming the gate oxide layer and the gate:
forming a first isolation layer by deposition at the bottom of the etched trench,
correspondingly, the forming the gate oxide layer and the gate sequentially on the sidewall of each of the transistor pillars comprises:
forming, by in-situ oxidation, an initial gate oxide layer on the sidewall of each of the transistor pillars;
depositing a polysilicon material in the etched trench to form a polysilicon layer; and
etching the initial gate oxide layer and the polysilicon layer along the first direction, to remove part of the thicknesses of the initial gate oxide layer and the polysilicon layer in the first direction to form the gate oxide layer and the gate.

6. The method of claim 4, further comprising after forming the gate oxide layer and the gate:

forming a second isolation layer by deposition in the etched trench, wherein the second isolation layer is located within a projection region of the transistor pillar in the second direction, and a size of the second isolation layer in a third direction is equal to a size of the transistor pillar in the third direction.

7. The method of claim 6, further comprising before forming the drain:
thinning the wafer from a second surface of the wafer until exposing the first isolation layer and the second end of the transistor pillar, wherein the second surface of the wafer is a surface opposite to the first surface of the wafer.

8. The method of claim 3, wherein the etching each of the silicon pillars and the insulating layer to form the transistor pillar having the exposed L-shaped surface comprises:
partially etching each of the silicon pillars and the insulating layer along the first direction with a position of an edge of each of the silicon pillars as an etching start point, to remove the silicon pillar and the insulating layer with a preset size in a second direction and with a second preset thickness in the first direction, to form the transistor pillar having the L-shaped surface and form an etched trench, wherein the second preset thickness is smaller than the first preset thickness, the preset size is smaller than an initial size of each of the silicon pillars in the second direction which is perpendicular to the first direction.

9. The method of claim 8, wherein the L-shaped surface comprises a vertical surface and a horizontal surface perpendicular to the vertical surface; the forming the gate oxide layer and the gate sequentially on the L-shaped surface of each of the transistor pillars comprises:
forming, by in-situ oxidation, an initial gate oxide layer on each of the vertical surface and the horizontal surface;
depositing a polysilicon material in the etched trench having the initial gate oxide layer to form a polysilicon layer; and
etching the initial gate oxide layer and the polysilicon layer along the first direction, to remove part of the thicknesses of the initial gate oxide layer and the polysilicon layer in the first direction to form the gate oxide layer and the gate.

10. The method of claim 9, further comprising after forming the gate oxide layer and the gate:
forming an isolation layer by deposition in the etched trench, wherein the isolation layer is located within a projection region of the transistor pillar in the second direction, and a size of the isolation layer in a third direction is equal to a size of the transistor pillar in the third direction.

11. The method of claim 10, further comprising before forming the drain:
thinning the wafer from a second surface of the wafer to remove a part of the wafer with a third preset thickness and expose the second end of the transistor pillar, wherein the third preset thickness is smaller than a difference between the initial thickness and the second preset thickness, and the second surface of the wafer is a surface opposite to the first surface of the wafer.

12. The method of claim 11, wherein the forming the drain at the second end of the transistor pillar comprises:
performing ion implantation on the second end of the transistor pillar to a preset depth to form the drain, wherein the preset depth is smaller than or equal to the difference between the initial thickness and the second preset thickness.

13. The method of claim 1, wherein shapes of the source and the drain are the same or different;
the shapes of the source and the drain comprise any one of a square, a semicircle, a triangle, or any polygon.

14. A transistor manufactured by the method of claim 1, comprising:
the channel region;
the source located at a first end of the channel region;
the drain located at a second end of the channel region, wherein the first end and the second end are opposite ends of the channel region in the first direction which is the thickness direction of the wafer forming the channel region;
the gate located on any side of the channel region and corresponding to the channel region; and
the gate oxide layer located between the channel region and the gate.

15. The transistor of claim 14, wherein the source, the channel region and the drain form an L-shaped structure or a columnar structure.

16. A semiconductor device, comprising at least one memory cell, a word line and a bit line, wherein each of the at least one memory cell comprises at least the transistor of claim 14, and the transistor comprises at least the gate, the source and the drain;
the word line is connected to the gate of the transistor, and is configured to provide a word line voltage and control the transistor to be turned on or off by the word line voltage;
the bit line is connected to the source or the drain of the transistor, and is configured to perform a read or write operation on each of the at least one memory cell when the transistor is turned on.

17. The semiconductor device of claim 16, wherein each of the at least one memory cell further comprises a storage capacitor;
the storage capacitor has one end connected to the drain or the source of the transistor and the other end grounded, and is configured to store data written in each of the at least one memory cell.

18. The semiconductor device of claim 16, wherein each of the at least one memory cell further comprises an adjustable resistor;
the adjustable resistor is connected between the bit line and the source of the transistor, or is connected between the bit line and the drain of the transistor, and is configured to adjust a state of data stored in each of the at least one memory cell by a bit line voltage provided by the bit line.

19. The semiconductor device of claim 16, wherein when the semiconductor device comprises a plurality of memory cells, the plurality of memory cells are connected in parallel or in series.

20. A method for forming a semiconductor device, comprising:
forming at least one memory cell, each of which comprising at least a transistor comprising a gate, a source and a drain, and manufactured by the method for manufacturing the transistor of claim 1;
forming a word line connected to the gate of the transistor, and configured to provide a word line voltage and control the transistor to be turned on or off by the word line voltage; and
forming a bit line connected to the source or the drain of the transistor, and configured to perform a read or write operation on each of the at least one memory cell when the transistor is turned on.

* * * * *